United States Patent
Huang

(10) Patent No.: US 12,538,788 B2
(45) Date of Patent: Jan. 27, 2026

(54) SEMICONDUCTOR DEVICE WITH FILLING LAYER AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 422 days.

(21) Appl. No.: 18/132,418

(22) Filed: Apr. 10, 2023

(65) Prior Publication Data
US 2024/0339400 A1    Oct. 10, 2024

(51) Int. Cl.
*H01L 23/528* (2006.01)
*H01L 21/768* (2006.01)
*H01L 23/532* (2006.01)

(52) U.S. Cl.
CPC .... *H01L 23/5283* (2013.01); *H01L 21/76804* (2013.01); *H01L 21/76877* (2013.01); *H01L 23/53266* (2013.01)

(58) Field of Classification Search
CPC .......... H01L 23/5283; H01L 21/76804; H01L 21/76877; H01L 23/53266; H01L 21/76885
See application file for complete search history.

(56) References Cited

U.S. PATENT DOCUMENTS

| 5,686,339 | A | * | 11/1997 | Lee | H10D 1/68 257/306 |
| 5,897,370 | A | * | 4/1999 | Joshi | H01L 21/3212 438/668 |
| 6,559,499 | B1 | * | 5/2003 | Alers | H10D 1/692 257/E21.252 |
| 7,102,189 | B2 | * | 9/2006 | Nishikawa | H10D 1/694 257/311 |
| 11,476,365 | B2 | * | 10/2022 | Chu | H10D 84/038 |
| 11,749,730 | B2 | * | 9/2023 | Huang | H10D 64/62 257/734 |
| 2007/0145591 | A1 | * | 6/2007 | Yano | H01L 23/53295 257/E23.145 |

(Continued)

FOREIGN PATENT DOCUMENTS

| TW | 202249249 A | 12/2022 |
| TW | 202305895 A | 2/2023 |

OTHER PUBLICATIONS

Office Action and Search Report mailed on Aug. 26, 2024 related to Taiwanese Application No. 113100267.

(Continued)

*Primary Examiner* — Bac H Au
(74) *Attorney, Agent, or Firm* — Xuan Zhang

(57) ABSTRACT

The present application discloses a semiconductor device and a method for fabricating the semiconductor device. The semiconductor device includes a substrate; a conductive structure including a conductive concave layer positioned on the substrate and including a top surface having a V-shaped cross-sectional profile; and a conductive filling layer positioned on the conductive concave layer; and a top conductive layer positioned on the conductive structure. The conductive filling layer includes germanium or silicon germanium.

15 Claims, 23 Drawing Sheets

(56) References Cited

U.S. PATENT DOCUMENTS

| | | | |
|---|---|---|---|
| 2015/0214159 A1* | 7/2015 | Chang | H01L 23/53238 |
| | | | 257/751 |
| 2019/0164887 A1* | 5/2019 | Wang | H01L 23/5283 |
| 2019/0214296 A1* | 7/2019 | Wang | H01L 21/76876 |
| 2020/0135647 A1* | 4/2020 | Hsu | H10D 62/80 |
| 2021/0057273 A1* | 2/2021 | Chen | H01L 23/53209 |
| 2021/0082744 A1* | 3/2021 | Lanzillo | H01L 21/76843 |
| 2021/0391255 A1* | 12/2021 | Chen | H01L 21/76802 |
| 2022/0068826 A1* | 3/2022 | Kuo | H01L 21/28562 |
| 2022/0399229 A1* | 12/2022 | Na | H01L 21/76844 |
| 2022/0399454 A1 | 12/2022 | Chou | |
| 2023/0026976 A1* | 1/2023 | Noh | H01L 21/76879 |
| 2023/0030411 A1 | 2/2023 | Chu et al. | |
| 2023/0154845 A1* | 5/2023 | Wang | H01L 21/76832 |
| | | | 257/774 |
| 2023/0307370 A1* | 9/2023 | Lee | H01L 21/76816 |
| 2024/0339401 A1* | 10/2024 | Huang | H01L 21/76804 |
| 2025/0006641 A1* | 1/2025 | Kang | H01L 23/5226 |

OTHER PUBLICATIONS

Office Action and Search Report mailed on Feb. 16, 2024 related to Taiwanese Application No. 112122397.

\* cited by examiner

SEMICONDUCTOR DEVICE WITH FILLING LAYER AND METHOD FOR FABRICATING THE SAME

TECHNICAL FIELD

The present disclosure relates to a semiconductor device and a method for fabricating the semiconductor device, and more particularly, to a semiconductor device with a filling layer and a method for fabricating the semiconductor device with the filling layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a conductive structure including a conductive concave layer positioned on the substrate and including a top surface having a V-shaped cross-sectional profile; and a conductive filling layer positioned on the conductive concave layer; and a top conductive layer positioned on the conductive structure. The conductive filling layer includes germanium or silicon germanium.

Another aspect of the present disclosure provides a semiconductor device including a bottom conductive layer; a conductive structure including a conductive concave layer positioned on the bottom conductive layer and including a top surface having a V-shaped cross-sectional profile; and a conductive filling layer positioned on the conductive concave layer; and a top conductive layer positioned on the conductive structure. The conductive filling layer includes germanium or silicon germanium.

Another aspect of the present disclosure provides a method for fabricating a semiconductor device including providing a substrate; forming a first dielectric layer on the substrate; forming a first opening along the first dielectric layer; forming a conductive concave layer in the first opening; forming a conductive filling layer on the conductive concave layer; and forming a top conductive layer on the conductive filling layer. A top surface of the conductive concave layer has a V-shaped cross-sectional profile. The conductive concave layer and the conductive filling layer together configure a conductive structure. The conductive filling layer includes germanium or silicon germanium.

Due to the design of the semiconductor device of the present disclosure, the resistance of the conductive structure may be reduced by employing the conductive filling layer including germanium. As a result, performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
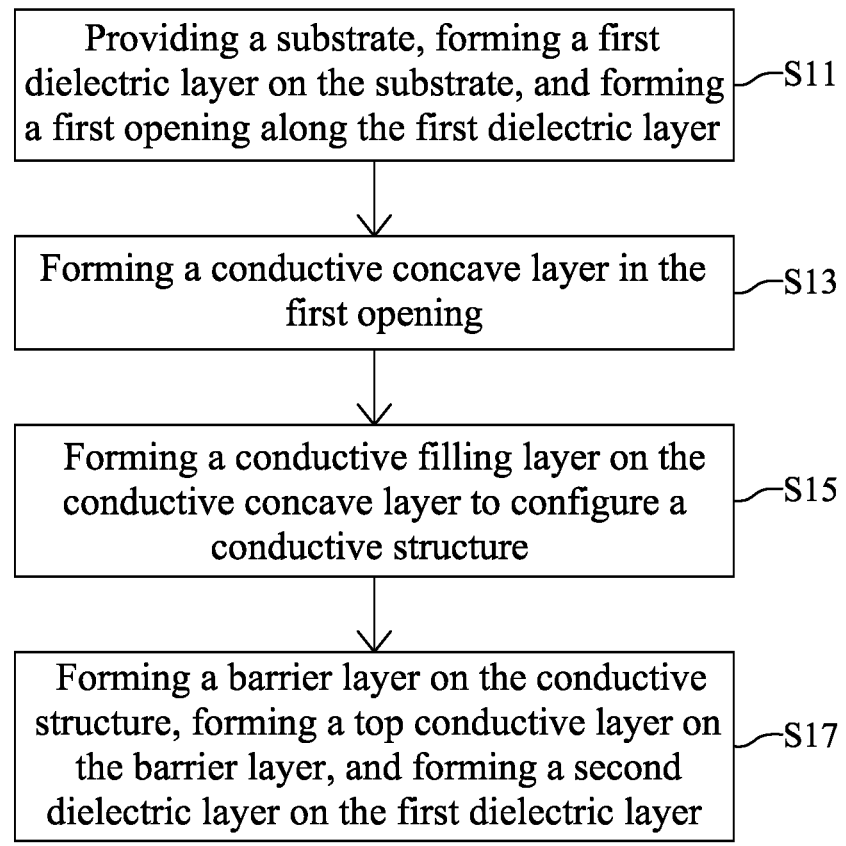
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 10 illustrate, in schematic cross-sectional view diagrams, a flow for fabricating the semiconductor device 1A in accordance with one embodiment of the present disclosure.

Figure 2:
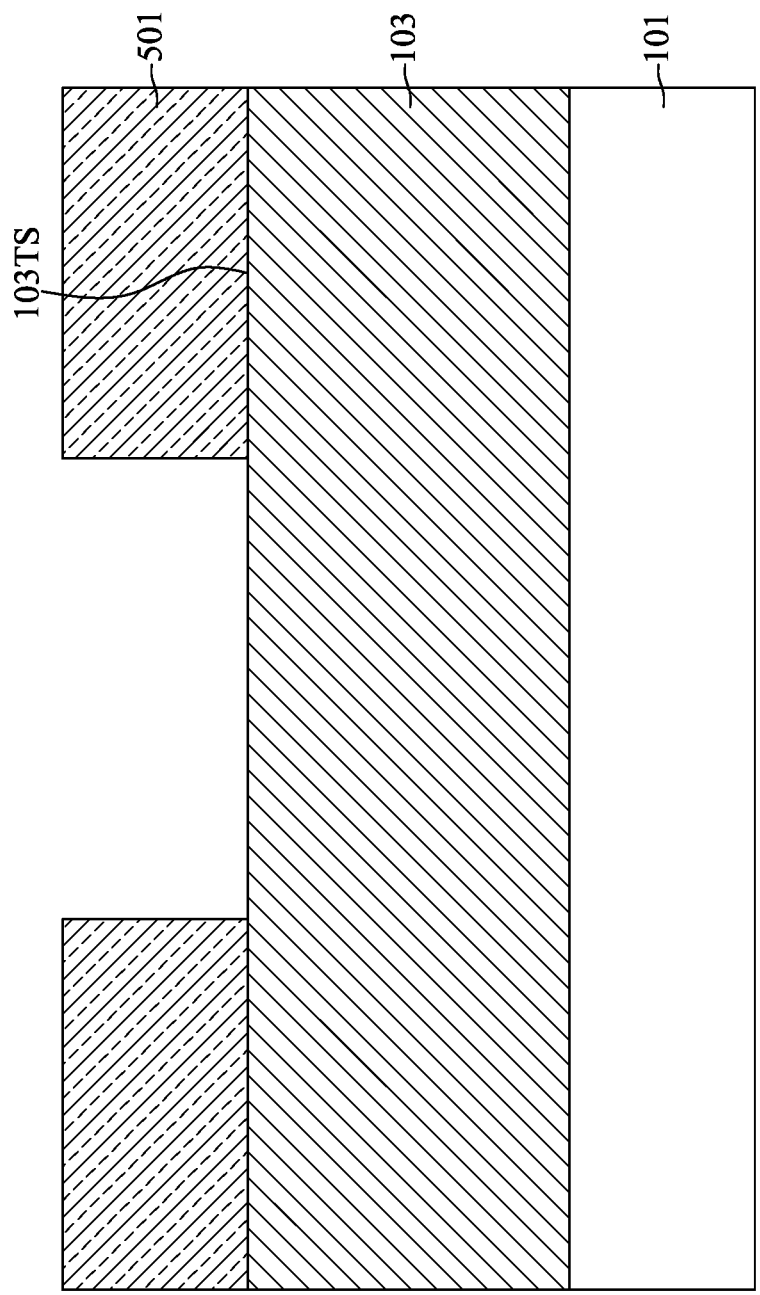
FIGS. 2 to 10 illustrate, in schematic cross-sectional view diagrams, a flow for fabricating the semiconductor device in accordance with one embodiment of the present disclosure.
Figure 3:
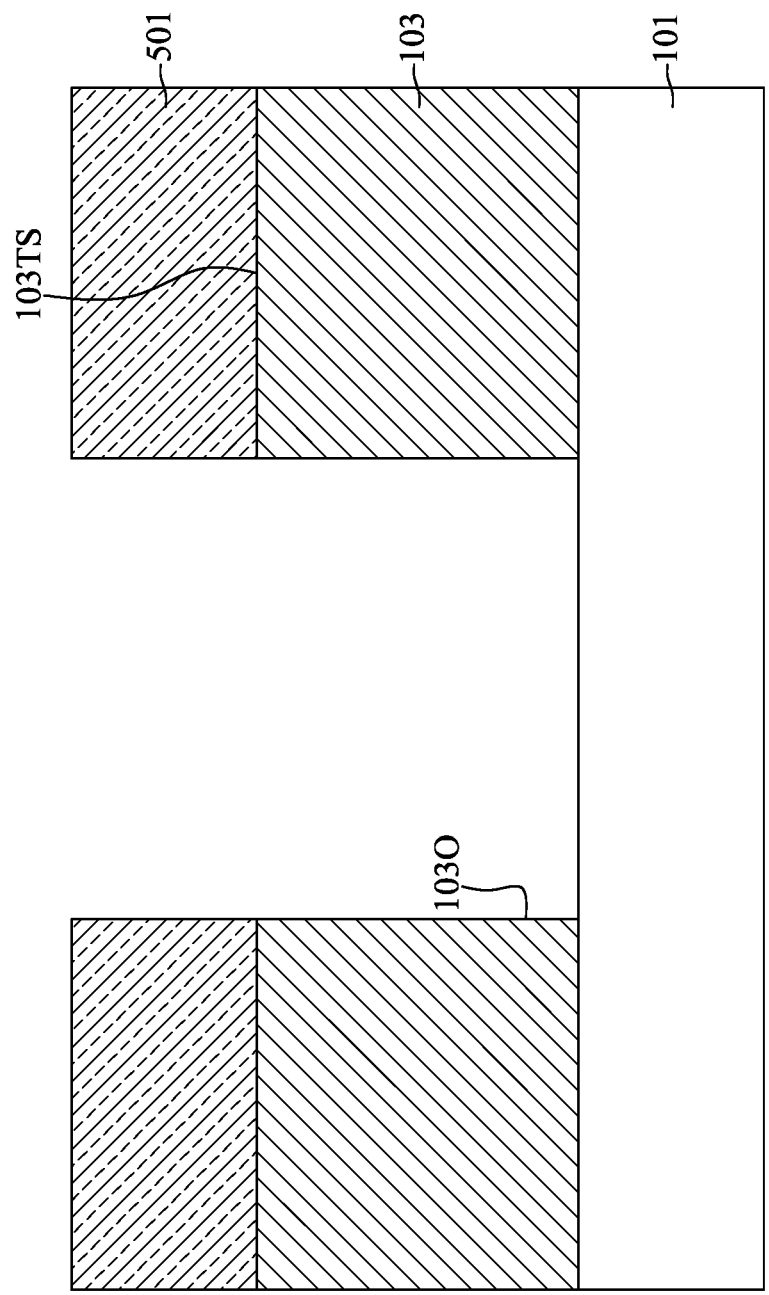

With reference to FIGS. 1 to 3, at step S11, a substrate 101 may be provided, a first dielectric layer 103 may be formed on the substrate 101, and a first opening 1030 may be formed along the first dielectric layer 103.

With reference to FIG. 2, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive layers may together configure functional units of the semiconductor device 1A. A functional unit, in the description of the present disclosure, generally refers to functionally related circuitry that has been partitioned for functional purposes into a distinct unit. In some embodiments, the functional units of the semiconductor device 1A may include, for example, highly complex circuits such as processor cores, memory controllers, accelerator units, or other applicable functional circuitry.

With reference to FIG. 2, the first dielectric layer 103 may be formed on substrate 101. In some embodiments, the first dielectric layer 103 may be part of the plurality of dielectric layers of the substrate 101. In some embodiments, the first dielectric layer 103 may be formed of a dielectric material including oxygen atoms and/or nitrogen atoms. In some embodiments, the first dielectric layer 103 may be formed of, for example, silicon oxide, borophosphosilicate glass, undoped silicate glass, fluorinated silicate glass, low-k dielectric materials such as a spin-on low-k dielectric layer or a chemical vapor deposition low-k dielectric layer, or a combination thereof. In some embodiments, the first dielectric layer 103 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 103 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps. In the present embodiment, the first dielectric layer 103 is formed of silicon oxide. In some embodiments, the first dielectric layer 103 may consist essentially of silicon oxide.

It should be noted that, in the description of the present disclosure, a feature which "consists essentially of" an identified material comprises greater than 95%, greater than 98%, greater than 99% or greater than 99.5% of the stated material on an atomic basis.

With reference to FIG. 2, the first mask layer 501 may be formed on the first dielectric layer 103. The first mask layer 501 may have the pattern of the first opening 1030. In some embodiments, the first mask layer 501 may be a photoresist layer.

With reference to FIG. 3, an etch process, such as an anisotropic dry etch process, may be performed using the first mask layer 501 as the mask to remove portions of the first dielectric layer 103. In some embodiments, the etch rate ratio of the first dielectric layer 103 to the first mask layer 501 may be between about 100:1 and about 1.05:1, between about 15:1 and about 2:1, or between about 10:1 and about 2:1 during the etch process. In some embodiments, the etch rate ratio of the first dielectric layer 103 to the substrate 101 may be between about 100:1 and about 1.05:1, between about 15:1 and about 2:1, or between about 10:1 and about 2:1 during the etch process. After the etch process, the first opening 1030 may be formed along the first dielectric layer 103. Portions of the substrate 101 may be exposed through the first opening 1030. The first mask layer 501 may be removed after the first opening 1030 are formed. In some embodiments, the sidewall of the first opening 1030 may be substantially vertical.

It should be noted that, in the description of the present disclosure, a surface is "substantially vertical" if there exists a vertical plane from which the surface does not deviate by more than three times the root mean square roughness of the surface.

Figure 4:
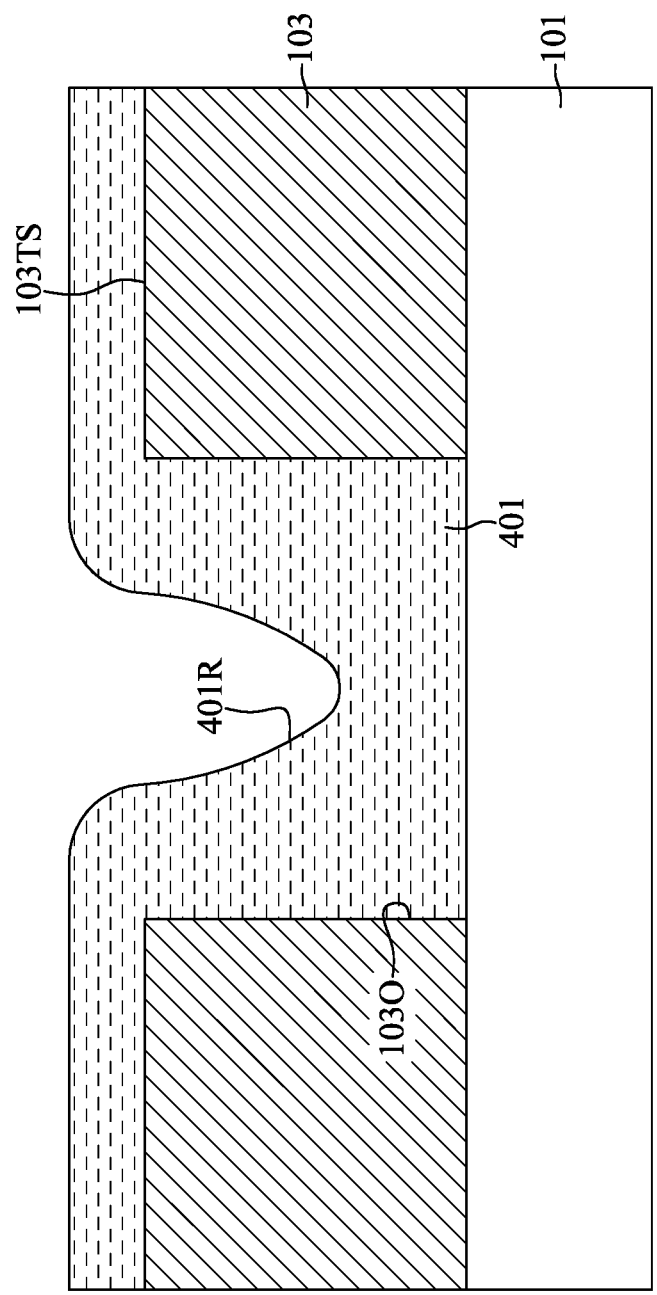
Figure 5:
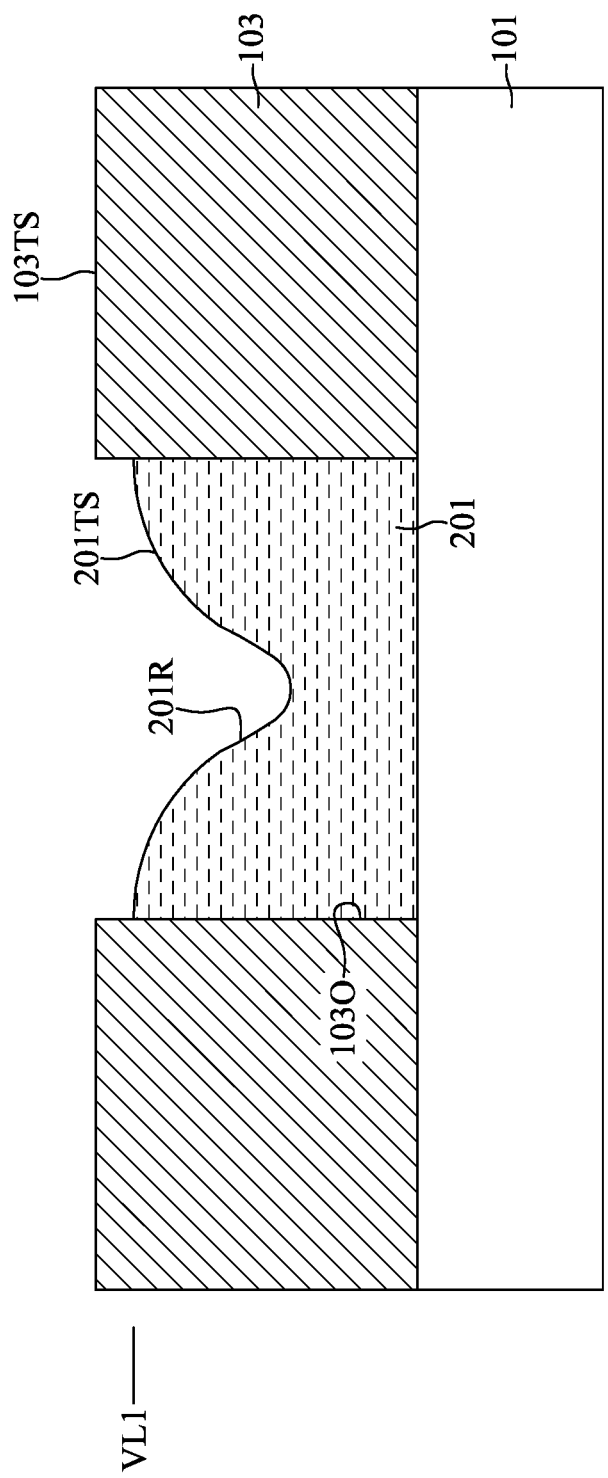

With reference to FIGS. 1, 4, and 5, at step S13, a conductive concave layer 201 may be formed in the first opening 1030.

With reference to FIG. 4, a layer of first conductive material 401 may be formed to partially fill the first opening 1030 with a void 401R and cover the top surface 103TS of the first dielectric layer 103. State differently, the layer of first conductive material 401 may extend along the top surface 103TS of the first dielectric layer 103 and may be downwardly bent along the first opening 1030 to contact the substrate 101. As a pattern of the semiconductor device is miniaturized, a size of the first opening 1030 becomes smaller, the layer of first conductive material 401 may not completely fill the first opening 1030, and the void 401R, a boundary of which is concave with respect to the top surface 103TS of the first dielectric layer 103 (or with respect to the substrate 101) may be formed. A thickness of the layer of first conductive material 401 may be thickly formed below the void 401R, but the present disclosure is not limited thereto.

In some embodiments, the first conductive material 401 may be a conductive material free of oxygen atoms and/or nitrogen atoms. In some embodiments, the first conductive material 401 may be, for example, polycrystalline silicon, polycrystalline germanium, polycrystalline silicon germanium, doped polycrystalline silicon, doped polycrystalline germanium, or doped polycrystalline silicon germanium. In some embodiments, the layer of first conductive material 401 may be formed by, for example, low-pressure chemical vapor deposition, high-density-plasma chemical vapor deposition, or other applicable deposition processes.

For one example, the layer of first conductive material 401 may be deposited by low-pressure chemical vapor deposition. The process pressure for depositing the layer of first conductive material 401 may be between about 0.1 Torr and about 50 Torr. The reaction gas for depositing the layer of first conductive material 401 may include a silicon source gas such as silane and/or a doping gas such as phosphine.

For another example, the layer of first conductive material 401 may be deposited by high-density-plasma chemical vapor deposition. The high-density-plasma chemical vapor deposition may employ a plasma having an ion density on the order of 1E11 ions/cm^3 or greater. The high-density-plasma chemical vapor deposition may also have an ionization fraction (ion/neutral ratio) on the order of 1E-4 or greater. The high-density-plasma chemical vapor deposition may include a pretreatment operation and a deposition operation.

In some embodiments, the pretreatment operation may include applying a hydrogen plasma to the first opening

1030. The deposition operation may include applying a silicon-source plasma to deposit the layer of first conductive material 401. A bias may be optionally applied during the deposition operation.

In some embodiments, during the pretreatment operation and the deposition operation, the substrate temperature may be below or about 500° C., below or about 450° C., or below or about 400° C. The substrate temperature may be controlled in a variety of ways. For example, the substrate temperature may be raised by a frontside plasma and may be cooled by a backside flow of helium.

In some embodiments, the hydrogen plasma may be generated using a hydrogen source. The hydrogen source may be, for example, hydrogen, ammonia, or hydrazine. In some embodiments, the silicon-source plasma may be generated using a silicon source. The silicon source may be, for example, silane, disilane, or other high order silanes.

In some embodiments, the hydrogen source and/or the silicon source may be combined with inert gases which may assist in stabilizing the high-density plasma. The inert gases may include argon, neon, and/or helium.

In some embodiments, a source of dopants may also be included during the deposition operation in order to incorporate dopants in the layer of first conductive material 401. The nature of the high-density plasma allows the dopants to bond more tightly within the layer of first conductive material 401 which obviates the requirement for a separate thermal dopant activation step. For one example, a boron-containing precursor (e.g., triethylborane, trimethylborane, borane, diborane, or higher order boranes) may be used as the source of dopants in order to put activated boron doping centers in the layer of first conductive material 401. For another example, a phosphorus-containing precursor (e.g., phosphine) may be used as the source of dopants in order to put activated phosphorus doping centers in the layer of first conductive material 401.

In some embodiments, the void 401R may have a U-shaped cross-sectional profile or a V-shaped cross-sectional profile. State differently, the top surface of the layer of the first conductive material 401 formed in the first opening 1030, which configures the void 401R, may have a U-shaped cross-sectional profile or a V-shaped cross-sectional profile.

With reference to FIG. 5, an etch back process may be performed to remove a portion of the first conductive material 401. In some embodiments, the etch rate ratio of the first conductive material 401 to the first dielectric layer 103 may be between about 100:1 and about 1.05:1, between about 15:1 and about 2:1, or between about 10:1 and about 2:1 during the etch back process. After the etch back process, the remaining first conductive material 401 may be referred to as the conductive concave layer 201. The void 401R may be turned into a recess 201R of the conductive concave layer 201, which may be referred to as part of the top surface 201TS of the conductive concave layer 201. In some embodiments, the recess 201R may have a U-shaped cross-sectional profile or a V-shaped cross-sectional profile. State differently, the top surface 201TS of the conductive concave layer 201, which configures the recess 201R, may have a U-shaped cross-sectional profile or a V-shaped cross-sectional profile. The top surface 201TS of the conductive concave layer 201 may be at a vertical level VL1 lower than the top surface 103TS of the first dielectric layer 103. A part of the top surface 201TS (i.e., the recess 201R) may be concave with respect to the substrate 101.

Figure 6:
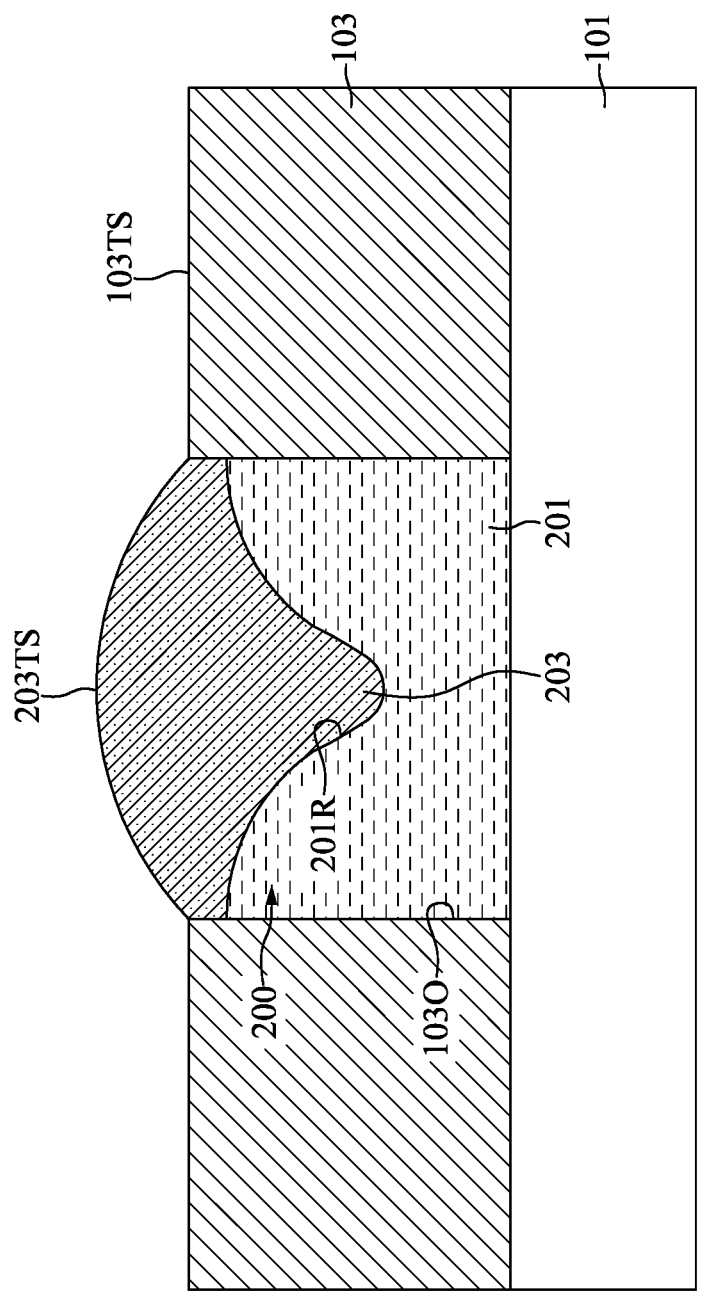
Figure 7:
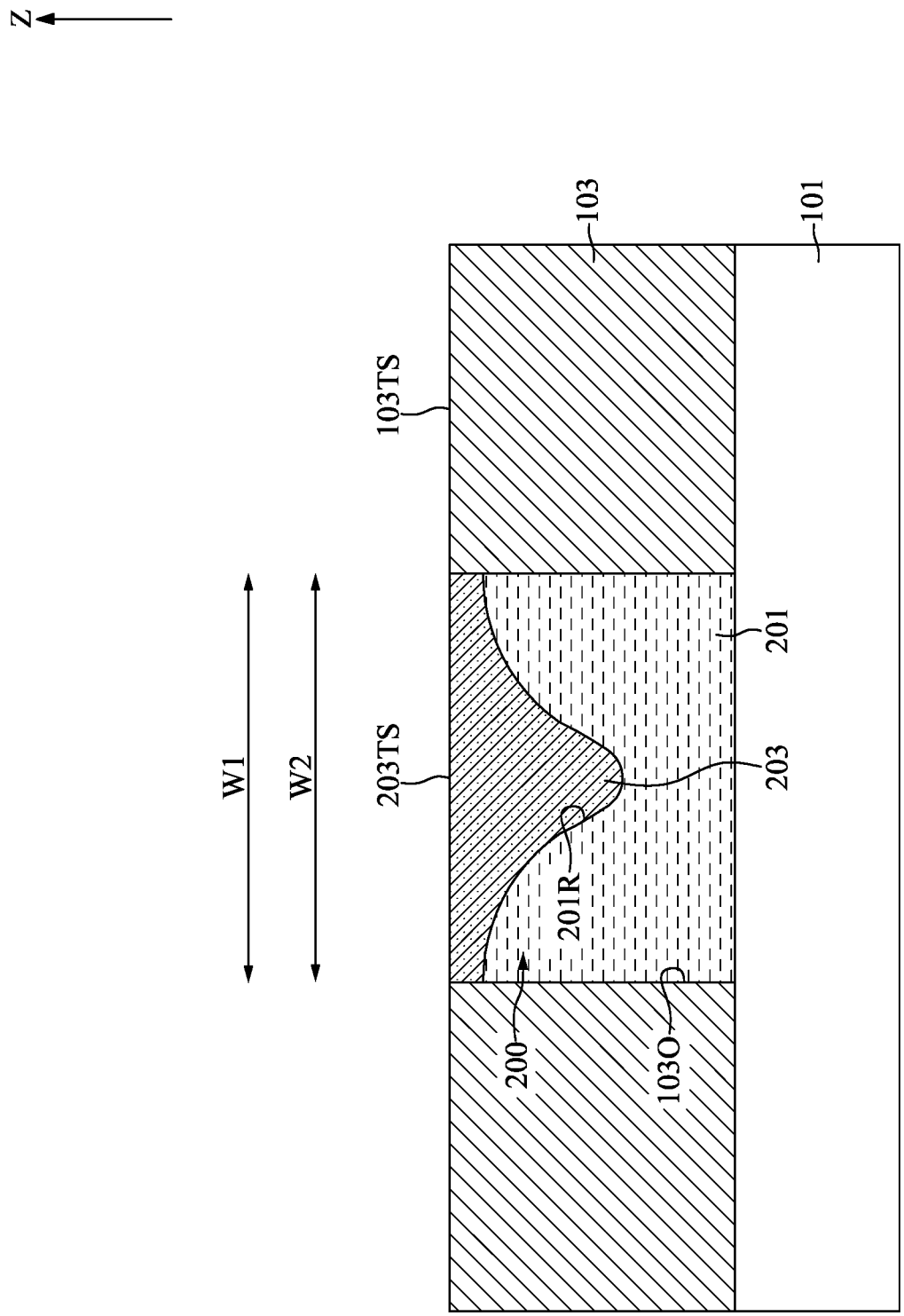

With reference to FIGS. 1, 6, and 7, at step S15, a conductive filling layer 203 may be formed on the conductive concave layer 201 to configure a conductive structure 200.

With reference to FIG. 6, the conductive filling layer 203 may be selectively deposited on the conductive concave layer 201 over the first dielectric layer 103. In the current stage, the top surface 203TS of the conductive filling layer 203 may be protruding from the top surface 103TS of the first dielectric layer 103. In other words, the top surface 203TS of the conductive filling layer 203 may be convex with respect to the top surface 103TS of the first dielectric layer 103 (or with respect to the substrate 101).

In some embodiments, the conductive filling layer 203 may be formed of, for example, germanium. In some embodiments, the conductive filling layer 203 may include an atomic percentage of germanium greater than or equal to 50%. In this regard, the conductive filling layer 203 may be described as a "germanium-rich layer". In some embodiments, the atomic percentage of germanium in the conductive filling layer 203 may be greater than or equal to 60%, greater than or equal to 70%, greater than or equal to 80% greater than or equal to 90%, greater than or equal to 95%, greater than or equal to 98%, greater than or equal to 99% or greater than or equal to 99.5%. Stated differently, in some embodiments, the conductive filling layer 203 consists essentially of germanium. In some embodiments, the conductive filling layer 203 may include silicon and germanium. Stated differently, in some embodiments, the conductive filling layer 203 may include silicon germanium.

In some embodiments, the conductive filling layer 203 may be formed by a deposition process. In some embodiments, the deposition process may include a reactive gas including a germanium precursor and/or hydrogen gas. In some embodiments, the germanium precursor may consist essentially of germane. In some embodiments, the germanium precursor may include one or more of germane, digermane, isobutylgermane, chlorogermane, or dichlorogermane. In some embodiments, the hydrogen gas may be used as a carrier or diluent for the germanium precursor. In some embodiments, the reactive gas may consist essentially of germane and hydrogen gas. In some embodiments, the molar percentage of germane in the reactive gas may be in a range of about 1% to about 50%, in a range of about 2% to about 30%, or in a range of about 5% to about 20%.

Alternatively, in some embodiments, the reactive gas may further include a silicon containing precursor. In some embodiments, the silicon containing precursor may include one or more of silane, a polysilane, or a halosilane. As used in this regard, a "polysilane" is a species with the general formula $Si_nH_{2n+2}$ where n is 2 to 6. Further, a "halosilane" is a species with the general formula $Si_aX_bH_{2a+2-b}$ where X is a halogen, a is 1 to 6, and b is 1 to 2a+2. In some embodiments, the silicon containing precursor comprises one or more of $SiH_4$, $Si_2H_6$, $Si_3H_8$, $Si_4H_{10}$, $SiCl_4$, or $SiH_2Cl_2$.

In some embodiments, the temperature of the intermediate semiconductor device to be deposited may be maintained during the deposition process. The temperature may be referred to as the substrate temperature. In some embodiments, the substrate temperature may be in a range between about 300° C. and about 800° C., between about 400° C. and about 800° C., between about 500° C. and about 800° C., between about 250° C. and about 600° C., between about 400° C. and about 600° C., or between about 500° C. and about 600° C. In some embodiments, the substrate temperature may be about 540° C.

In some embodiments, the pressure of the processing chamber for depositing the conductive filling layer 203 may be maintained during the deposition process. In some embodiments, the pressure is maintained in a range between about 1 Torr and about 300 Torr, between about 10 Torr and about 300 Torr, between about 50 Torr and about 300 Torr, between about 100 Torr and 300 Torr, between about 200 Torr and about 300 Torr, or between about 1 Torr and about 20 Torr. In some embodiments, the pressure may be maintained at about 13 Torr.

In some embodiments, the selectivity of the deposition may be greater than or equal to 5, greater than or equal to 10, greater than or equal to 20, greater than or equal to 30, or greater than or equal to 50. In some embodiments, the conductive filling layer 203 may be deposited on the conductive concave layer 201 to a thickness before deposition is observed on the first dielectric layer 103.

It should be noted that, in the description of the present disclosure, the term "selectively depositing a layer on a first feature over a second feature", and the like, means that a first amount of the layer is deposited on the first feature and a second amount of the layer is deposited on the second feature, where the first amount of the layer is greater than the second amount of the layer, or no layer is deposited on the second feature. The selectivity of a deposition process may be expressed as a multiple of growth rate. For example, if one surface is deposited on twenty-five times faster than a different surface, the process would be described as having a selectivity of 25:1 or simply 25. In this regard, higher ratios indicate more selective deposition processes.

The term "over" used in this regard does not imply a physical orientation of one feature on top of another feature, rather a relationship of the thermodynamic or kinetic properties of the chemical reaction with one feature relative to the other feature. For example, selectively depositing a germanium layer onto a silicon surface over a dielectric surface means that the germanium layer deposits on the silicon surface and less or no germanium layer deposits on the dielectric surface; or that the formation of a germanium layer on the silicon surface is thermodynamically or kinetically favorable relative to the formation of a germanium layer on the dielectric surface.

With reference to FIG. 7, a planarization process, such as chemical mechanical polishing, may be performed to remove excess material and provide a substantially flat surface for subsequent processing steps. In the current stage, the top surface 203TS of the conductive filling layer 203 may be substantially coplanar with the top surface 103TS of the first dielectric layer 103. In some embodiments, the width W1 of the conductive concave layer 201 and the width W2 of the conductive filling layer 203 may be substantially the same.

With reference to FIG. 1 and FIGS. 8 to 10, at step S17, a barrier layer 105 may be formed on the conductive structure 200, a top conductive layer 107 may be formed on the barrier layer 105, and a second dielectric layer 109 may be formed on the first dielectric layer 103.

Figure 8:
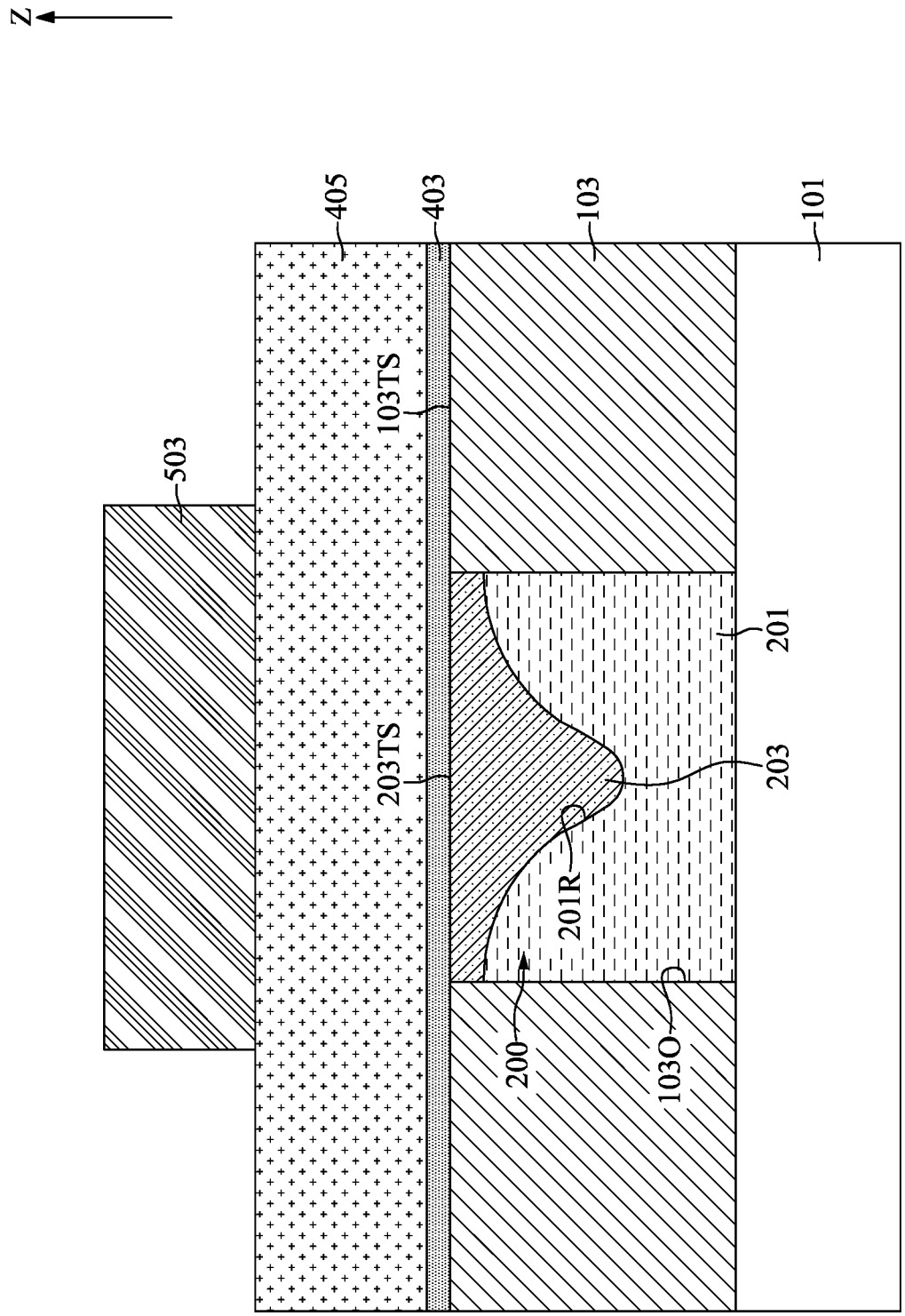

With reference to FIG. 8, a layer of barrier material 403 may be formed on the first dielectric layer 103 and on the conductive structure 200. In some embodiments, the barrier material 403 may be formed of, for example, titanium, titanium nitride, tantalum, tantalum nitride, or a combination thereof. In some embodiments, the layer of barrier material 403 may be a multi-layer structure. For example, the layer of barrier material 403 may be a titanium/titanium bi-layer or a tantalum/tantalum nitride bi-layer. In some embodiments, the layer of barrier material 403 may be formed by, for example, chemical vapor deposition, atomic layer deposition, or other applicable deposition process.

For example, when the barrier material 403 is titanium nitride, the layer of barrier material 403 may be formed by chemical vapor deposition. In some embodiments, the formation of the layer of barrier material 403 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the layer of barrier material 403.

Detailedly, the intermediate semiconductor device illustrated in FIG. 7 may be loaded in a reaction chamber. In the source gas introducing step, source gases containing a precursor and a reactant may be introduced to the reaction chamber containing the intermediate semiconductor device. The precursor and the reactant may diffuse across the boundary layer and reach the surface of the intermediate semiconductor device (i.e., the top surface 103TS of the first dielectric layer 103 and the top surface 203TS of the conductive filling layer 203). The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, a purge gas such as argon may be injected into the reaction chamber to purge out the gaseous byproducts, unreacted precursor, and unreacted reactant.

In the reactant flowing step, the reactant may be solely introduced to the reaction chamber to turn the continuous thin film into the layer of barrier material 403. In the second purging step, a purge gas such as argon may be injected into the reaction chamber to purge out the gaseous byproducts and unreacted reactant.

In some embodiments, the formation of the layer of barrier material 403 using chemical vapor deposition may be performed with the assistance of plasma. The source of the plasma may be, for example, argon, hydrogen, or a combination thereof.

For example, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the layer of barrier material 403.

With reference to FIG. 8, in some other embodiments, the layer of barrier material 403 may be formed by atomic layer deposition such as photo-assisted atomic layer deposition or liquid injection atomic layer deposition. In some embodiments, the formation of the layer of barrier material 403 may include a first precursor introducing step, a first purging step, a second precursor introducing step, and a second purging step. The first precursor introducing step, the first purging step, the second precursor introducing step, and the second purging step may be referred to as one cycle. Multiple cycles may be performed to obtain the desired thickness of the layer of barrier material 403.

Detailedly, the intermediate semiconductor device illustrated in FIG. 7 may be loaded in the reaction chamber. In the first precursor introducing step, a first precursor may be introduced to the reaction chamber. The first precursor may diffuse across the boundary layer and reach the surface of the intermediate semiconductor device (i.e., the top surface 103TS of the first dielectric layer 103 and the top surface 203TS of the conductive filling layer 203). The first precursor may adsorb on the surface aforementioned to form a monolayer at a single atomic layer level. In the first purging step, a purge gas such as argon may be injected into the reaction chamber to purge out unreacted first precursor.

In the second precursor introducing step, a second precursor may be introduced to the reaction chamber. The second precursor may react with the monolayer and turn the monolayer into the layer of barrier material 403. In the second purging step, a purge gas such as argon may be injected into the reaction chamber to purge out unreacted second precursor and gaseous byproduct. Compared to the chemical vapor deposition, a particle generation caused by a gas phase reaction may be suppressed because the first precursor and the second are separately introduced.

For example, the first precursor may be titanium tetrachloride. The second precursor may be ammonia. Adsorbed titanium tetrachloride may form a titanium nitride monolayer. The ammonia in the second precursor introducing step may react with the titanium nitride monolayer and turn the titanium nitride monolayer into the layer of barrier material 403.

In some embodiments, the formation of the layer of barrier material 403 using atomic layer deposition may be performed with the assistance of plasma. The source of the plasma may be, for example, argon, hydrogen, oxygen, or a combination thereof. In some embodiments, the oxygen source may be, for example, water, oxygen gas, or ozone. In some embodiments, co-reactants may be introduced to the reaction chamber. The co-reactants may be selected from the group consisting of hydrogen, hydrogen plasma, oxygen, air, water, ammonia, hydrazines, alkylhydrazines, boranes, silanes, ozone and a combination thereof.

In some embodiments, the formation of the layer of barrier material 403 may be performed using the following process conditions. The substrate temperature may be between about 160° C. and about 300° C. The evaporator temperature may be about 175° C. The pressure of the reaction chamber may be about 5 mbar. The solvent for the first precursor and the second precursor may be toluene.

With reference to FIG. 8, a layer of second conductive material 405 may be formed on the layer of barrier material 403. In some embodiments, the second conductive material 405 may be, for example, aluminum, tungsten, copper, or a combination thereof. In some embodiments, the layer of second conductive material 405 may be formed by, for example, chemical vapor deposition, physical vapor deposition, electroplating, electroless plating, or other applicable deposition process.

With reference to FIG. 8, a second mask layer 503 may be formed on the layer of second conductive material 405. The second mask layer 503 may include the pattern of the top conductive layer 107. In some embodiments, the second mask layer 503 may be a photoresist layer.

Figure 9:
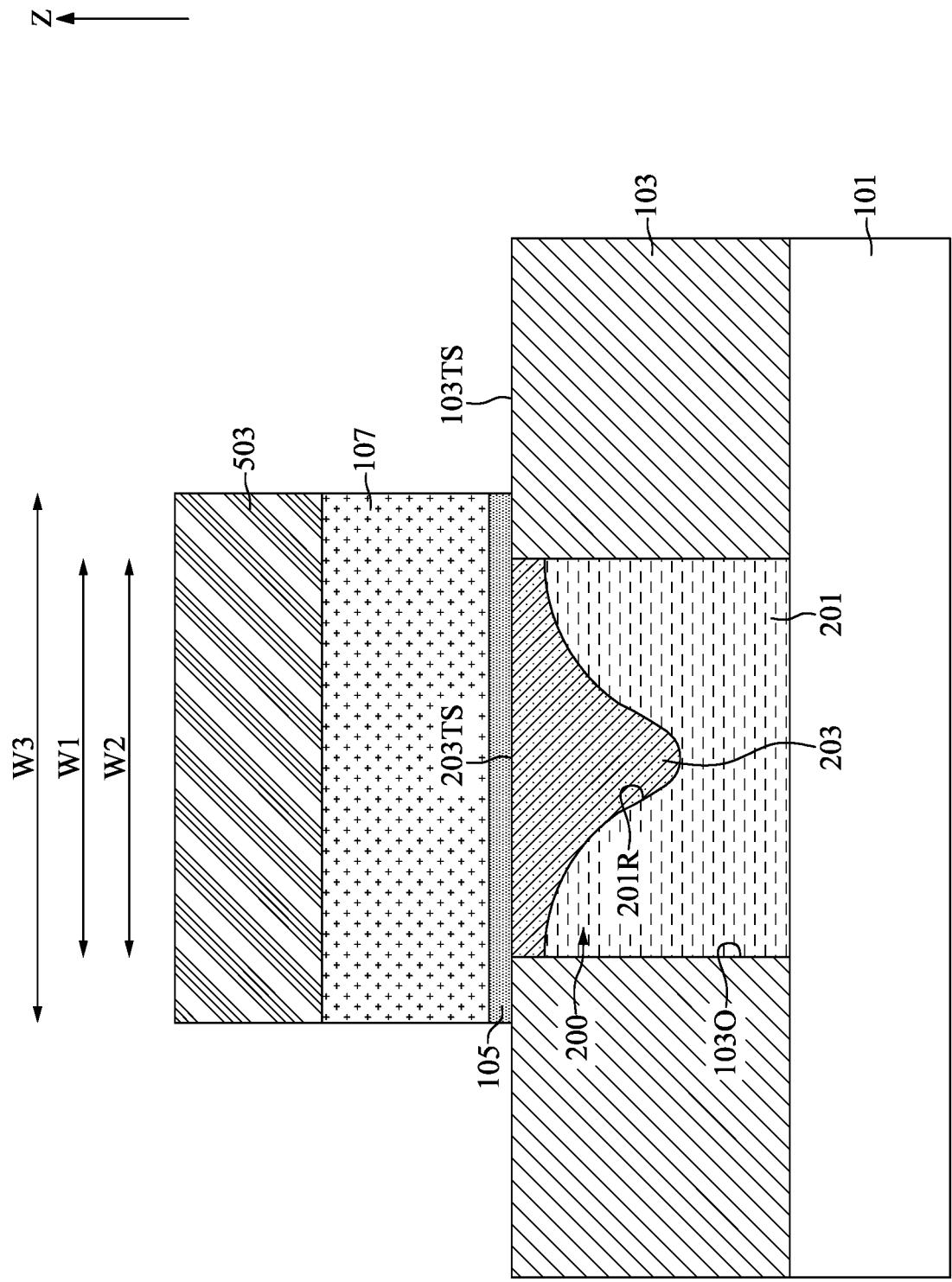

With reference to FIG. 9, an etching process may be performed to remove portions of the barrier material 403 and the second conductive material 405 using the second mask layer 503 as the mask. After the etching process, the remaining barrier material 403 may be referred to as the barrier layer 105. The remaining second conductive material 405 may be referred to as the top conductive layer 107. In some embodiments, the etching process may be a multi-stage etching process. For example, the etching process may be a two-stage etching process. In some embodiments, etch rate ratio of the second conductive material 405 to the second mask layer 503 may be between about 100:1 and about 1.05:1, between about 15:1 and about 2:1, or between about 10:1 and about 2:1 during the etching process. In some embodiments, etch rate ratio of the second conductive material 405 to the barrier material 403 may be between about 100:1 and about 1.05:1, between about 15:1 and about 2:1, or between about 10:1 and about 2:1 during the etching process. In some embodiments, etch rate ratio of the barrier material 403 to the first dielectric layer 103 may be between about 100:1 and about 1.05:1, between about 15:1 and about 2:1, or between about 10:1 and about 2:1 during the etching process. After the etching process, the second mask layer 503 may be removed.

With reference to FIG. 9, the width W3 of the barrier layer 105 or the top conductive layer 107 may be greater than the width W1 of the conductive concave layer 201 or greater than the width W2 of the conductive filling layer 203.

Figure 10:
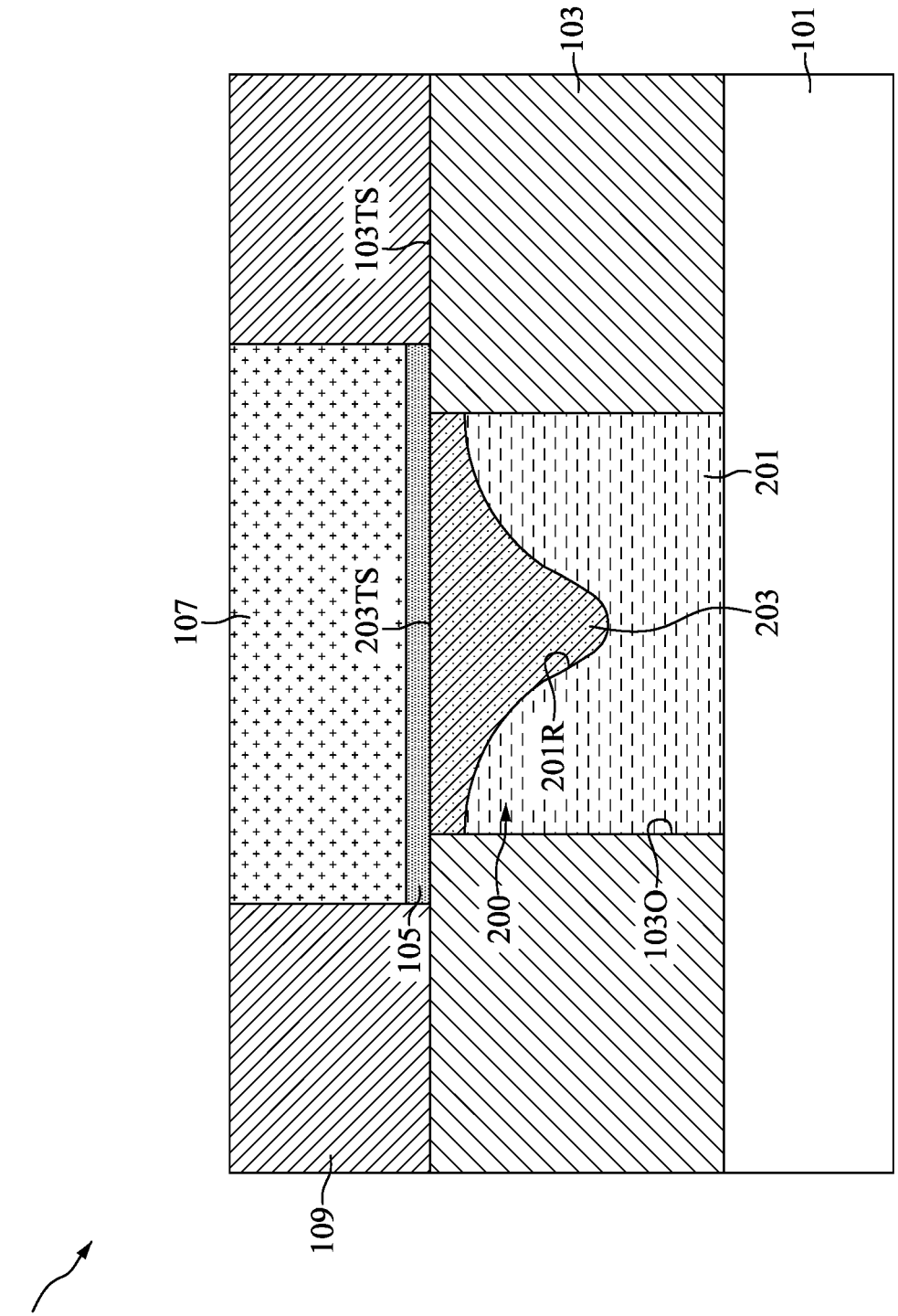

With reference to FIG. 10, a second dielectric layer 109 may be formed on the first dielectric layer 103 and cover the top conductive layer 107. A planarization process, such as chemical mechanical polishing, may be performed until the top surface of the top conductive layer 107 is exposed to remove excess material and provide a substantially flat surface for subsequent processing steps. In some embodiments, the second dielectric layer 109 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the second dielectric layer 109 may be formed by a deposition process including, for example, chemical vapor deposition, plasma enhanced chemical vapor deposition, evaporation, spin-on coating, or other applicable deposition process. In some embodiments, the second dielectric layer 109 and the first dielectric layer 103 may be formed of the same material. In some embodiments, the second dielectric layer 109 and the first dielectric layer 103 may be formed of different materials.

By employing the conductive filling layer 203, the resistance of the conductive structure 200 may be reduced. As a result, the performance of the semiconductor device 1A may be improved.

Figure 11:
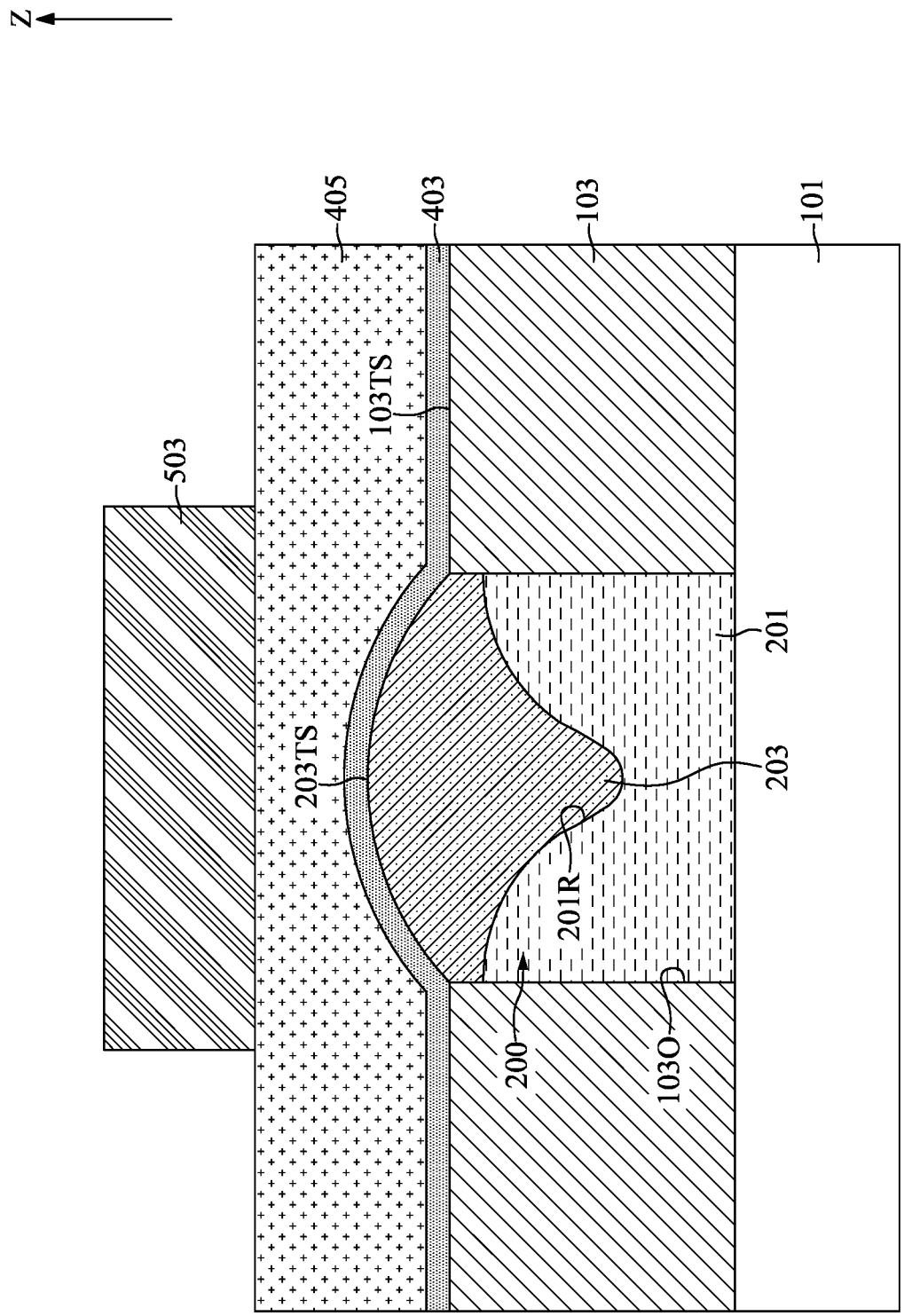
FIGS. 11 and 12 illustrate, in schematic cross-sectional view diagrams, part of a flow for fabricating a semiconductor device in accordance with another embodiment of the present disclosure.
Figure 12:
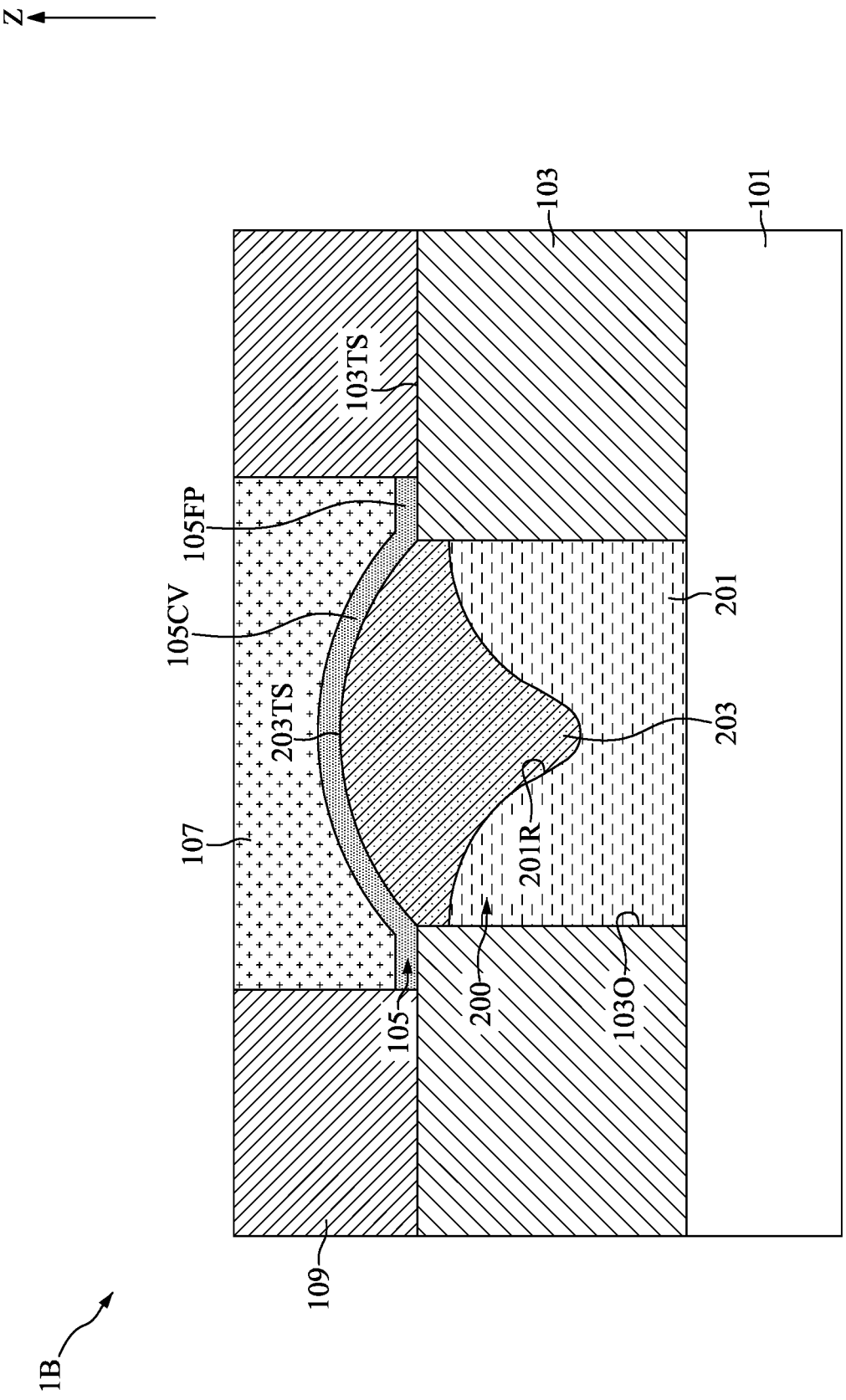

FIGS. 11 and 12 illustrate, in schematic cross-sectional view diagrams, part of a flow for fabricating a semiconductor device 1B in accordance with another embodiment of the present disclosure.

With reference to FIG. 11, an intermediate semiconductor device may be fabricated with a procedure similar to that illustrated in FIGS. 2 to 6, and descriptions thereof are not repeated herein. It should be noted that the no planarization process is performed to the conductive filling layer 203. As a result, the top surface 203TS of the conductive filling layer 203 is convex with respect to the top surface 103TS of the first dielectric layer 103 or the substrate 101. The layer of barrier material 403 may be directly formed on the conductive filling layer 203 and the first dielectric layer 103 with a procedure similar to that illustrated in FIG. 8, and descriptions thereof are not repeated herein. Due to no planarization process is performed to the conductive filling layer 203, the portion of the layer of barrier material 403 formed on the conductive filling layer 203 may be also convex with respect to the top surface 103TS of the first dielectric layer 103 of the substrate 101.

With reference to FIG. 11, the layer of second conductive material 405 may be formed on the layer of barrier material 403 with a procedure similar to that illustrated in FIG. 8, and descriptions thereof are not repeated herein. A planarization process, such as chemical mechanical polishing, may be performed to remove excess material and provide a substantially flat surface for subsequent processing steps. The second mask layer 503 may be formed on the layer of second conductive material 405 with a procedure similar to that illustrated in FIG. 8, and descriptions thereof are not repeated herein.

With reference to FIG. 12, the barrier layer 105 and the top conductive layer 107 may be formed with a procedure similar to that illustrated in FIG. 9, and descriptions thereof are not repeated herein. The second dielectric layer 109 may be formed with a procedure similar to that illustrated in FIG. 10, and descriptions thereof are not repeated herein.

With reference to FIG. 12, the top surface 203TS of conductive filling layer 203 may be convex with respect to the top surface 103TS of the first dielectric layer 103 or the substrate 101. The barrier layer 105 may include a convex portion 105CV and two flat portions 105FP. The convex portion 105CV may be conformally formed on the top surface 203TS of the conductive filling layer 203. The two flat portions 105FP may extend from two ends of the convex portion 105CV and conformally formed on the top surface 103TS of the first dielectric layer 103.

FIGS. 13 to 16 illustrate, in schematic cross-sectional view diagrams, part of a flow for fabricating a semiconductor device 1C in accordance with another embodiment of the present disclosure.

Figure 13:
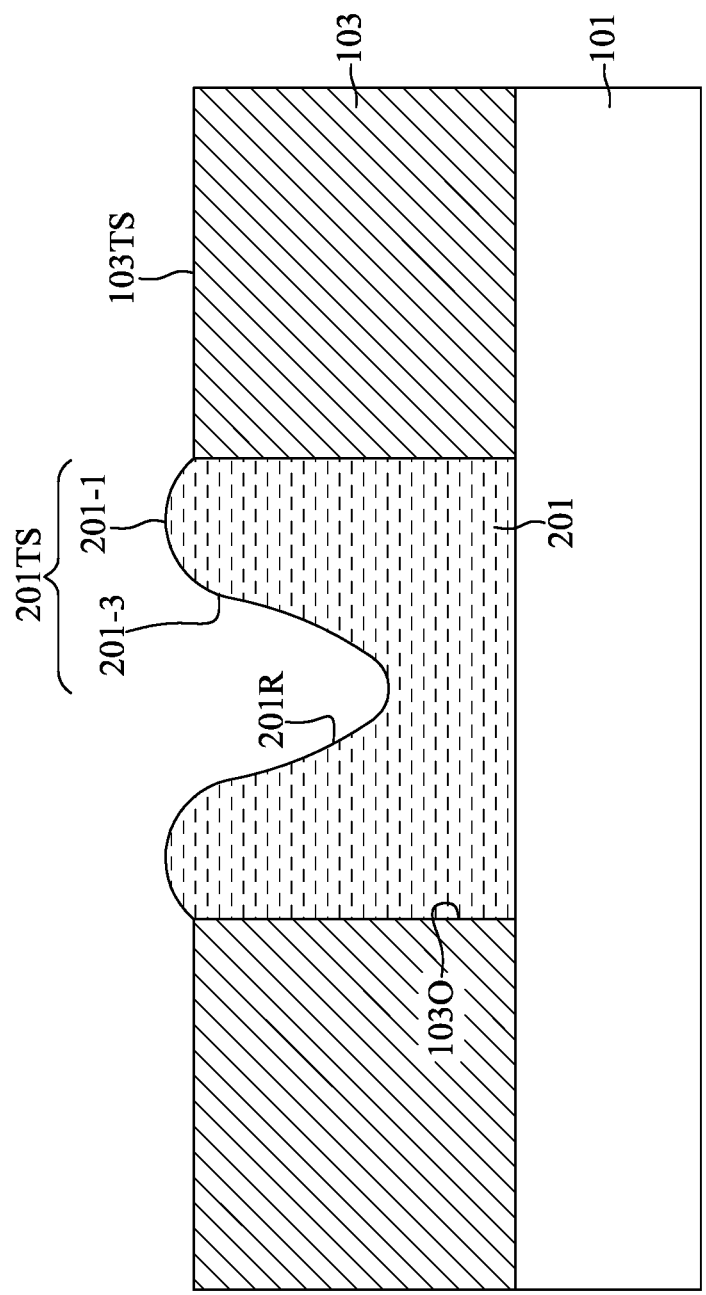
FIGS. 13 to 16 illustrate, in schematic cross-sectional view diagrams, part of a flow for fabricating a semiconductor device in accordance with another embodiment of the present disclosure.

With reference to FIG. 13, an intermediate semiconductor device may be fabricated with a procedure similar to that illustrated in FIGS. 2 to 6, and description thereof are not repeated herein. A planarization process may be performed until the top surface 103TS of the first dielectric layer 103 is exposed. After the planarization process, the recess 201R may remain in the conductive concave layer 201, and a first portion 201-1 of the top surface 201TS of the conductive concave layer 201 may be formed around the recess 201R and adjacent to the first dielectric layer 103. The first portion 201-1 of the top surface 201TS of the conductive concave layer 201 may have a convex surface with respect to the top surface 103TS of the first dielectric layer 103 or the substrate 101. In other words, the first portion 201-1 of the top surface 201TS of the conductive concave layer 201 may protrude from the top surface 103TS of the first dielectric layer 103. The surface of the recess 201R may correspond to the second portion 201-3 of the top surface 201TS of the conductive concave layer 201. The second portion 201-3 of the top surface 201TS of the conductive concave layer 201 may extend from the first portion 201-1 of the top surface 201TS of the conductive concave layer 201 and has a concave shape with respect to the top surface 103TS of the first dielectric layer 103 (or the substrate 101).

Figure 14:
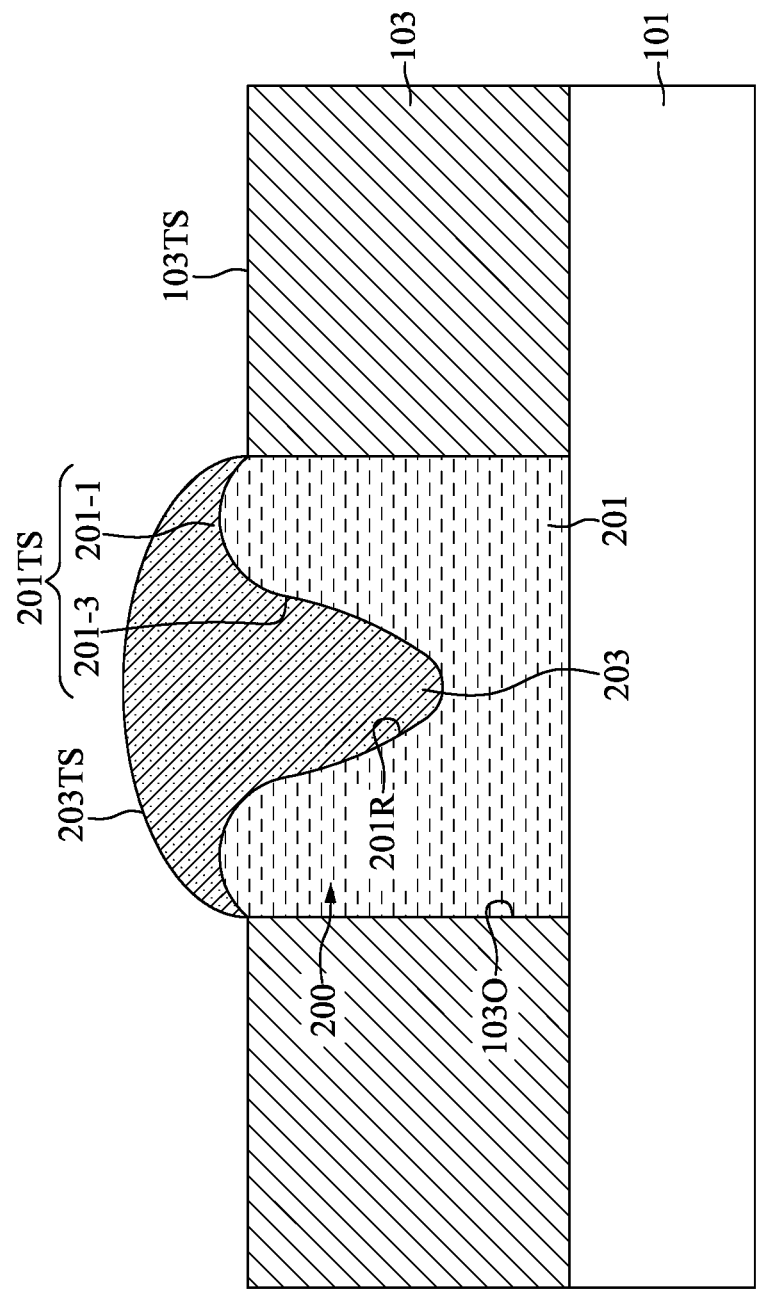

With reference to FIG. 14, the conductive filling layer 203 may be formed on the conductive concave layer 201 with a procedure similar to that illustrated in FIG. 6, and descriptions thereof are not repeated herein. In the current stage, the top surface 203TS of the conductive filling layer 203 may be protruding from the top surface 103TS of the first dielectric layer 103. In other words, the top surface 203TS of the conductive filling layer 203 may be convex with respect to the top surface 103TS of the first dielectric layer 103 (or with respect to the substrate 101).

Figure 15:
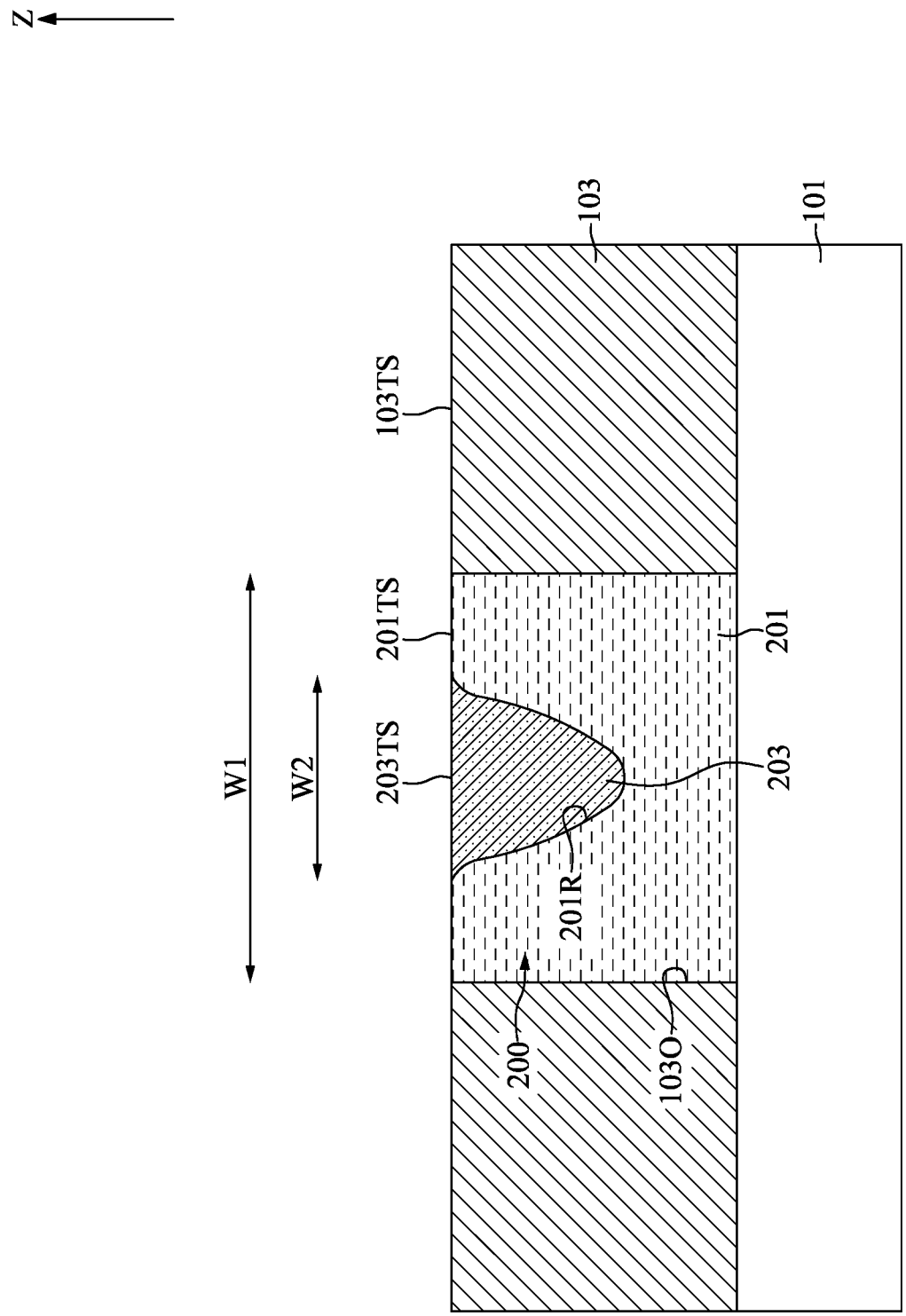

With reference to FIG. 15, a planarization process, such as chemical mechanical polishing, may be performed to remove excess material and provide a substantially flat surface for subsequent processing steps. In the current stage, the top surface 203TS of the conductive filling layer 203 may be substantially coplanar with the top surface 103TS of the first dielectric layer 103. In some embodiments, the top surface 201TS of the conductive concave layer 201 may be substantially coplanar with the top surface 203TS of the conductive filling layer 203. In some embodiments, the width W1 of the conductive concave layer 201 may be greater than the width W2 of the conductive filling layer 203.

Figure 16:
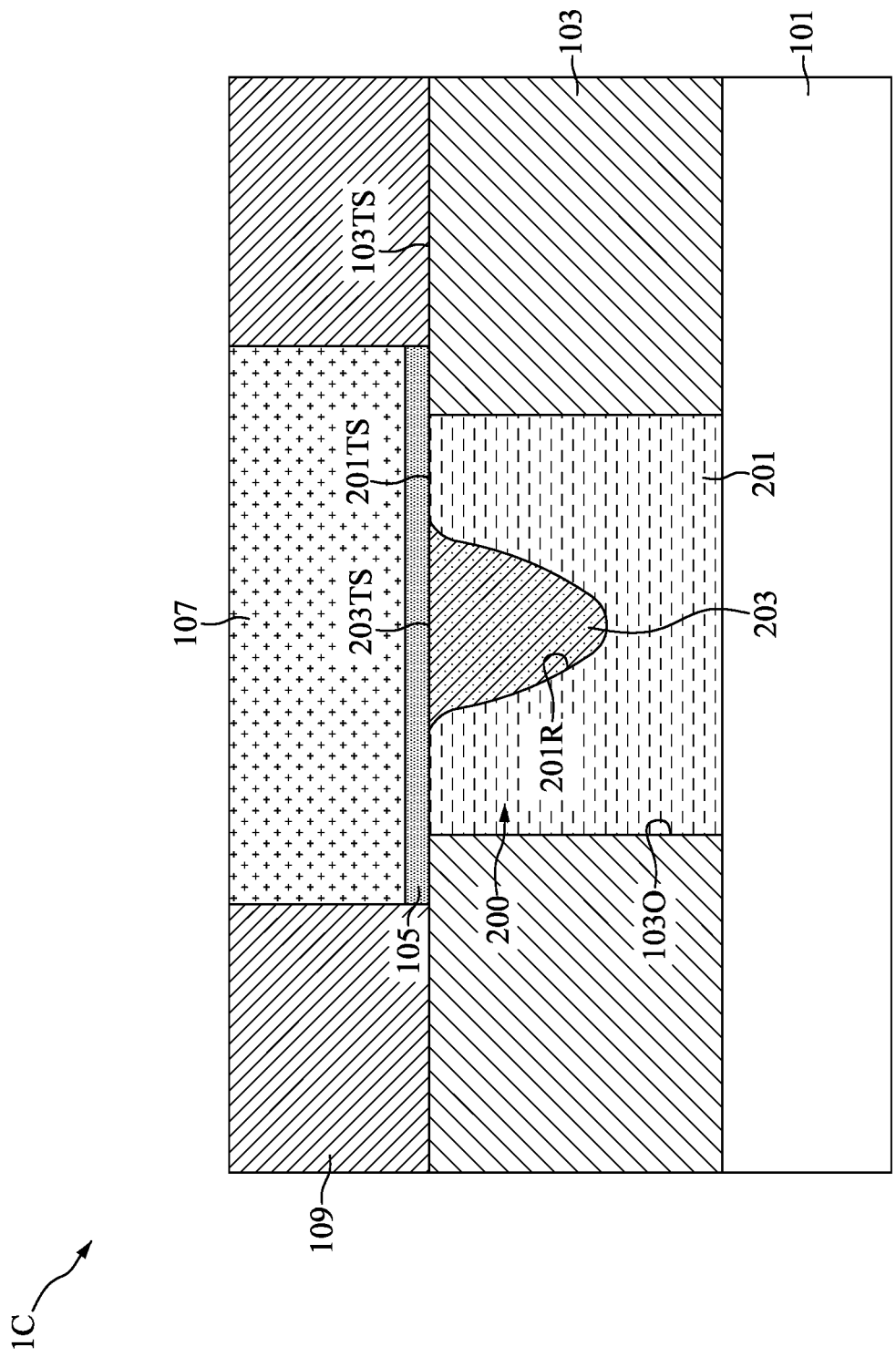

With reference to FIG. 16, the barrier layer 105, the top conductive layer 107, and the second dielectric layer 109 may be formed with a procedure similar to that illustrated in FIGS. 8 to 10, and descriptions thereof are not repeated herein.

Figure 17:
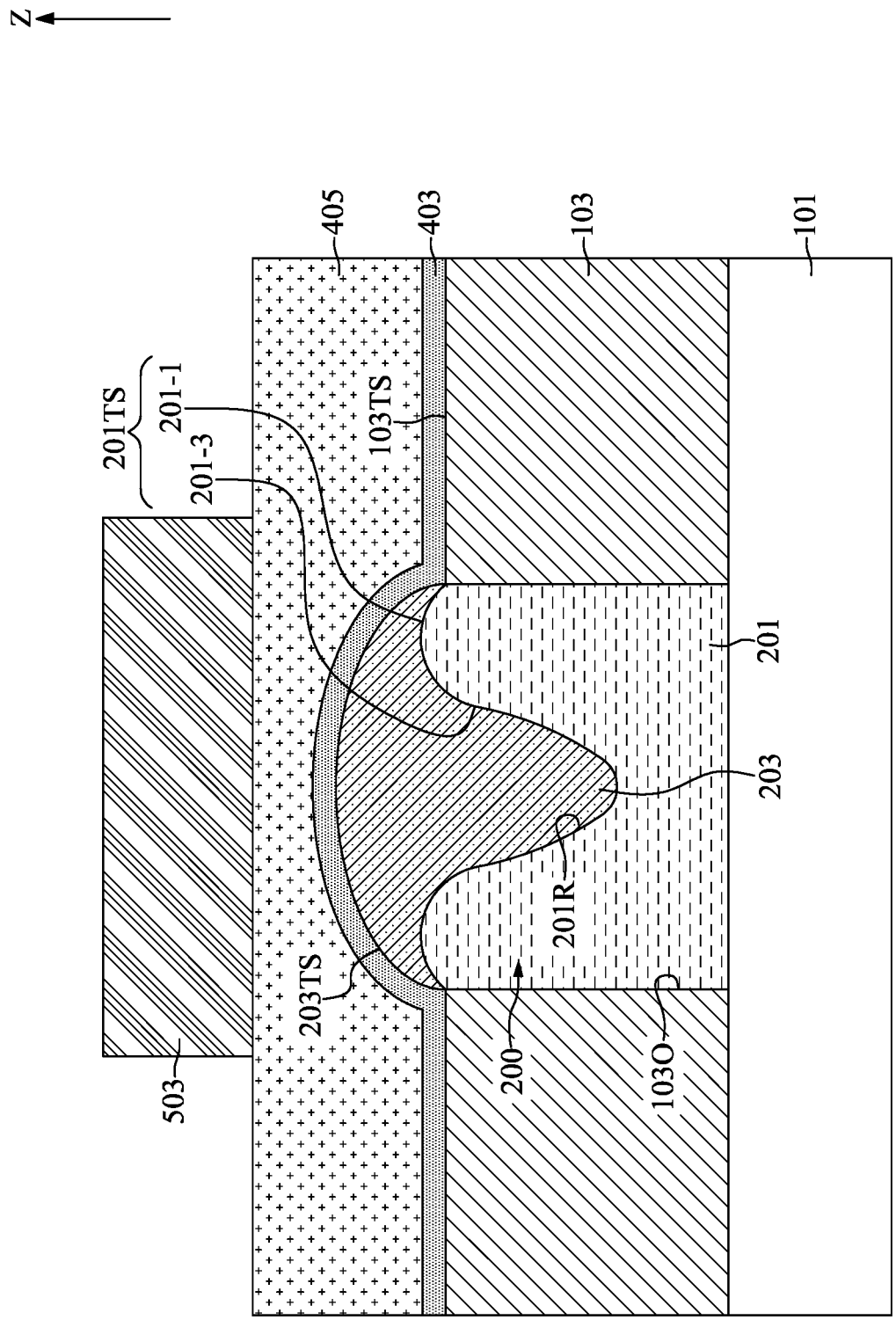
FIGS. 17 and 18 illustrate, in schematic cross-sectional view diagrams, part of a flow for fabricating a semiconductor device in accordance with another embodiment of the present disclosure.
Figure 18:
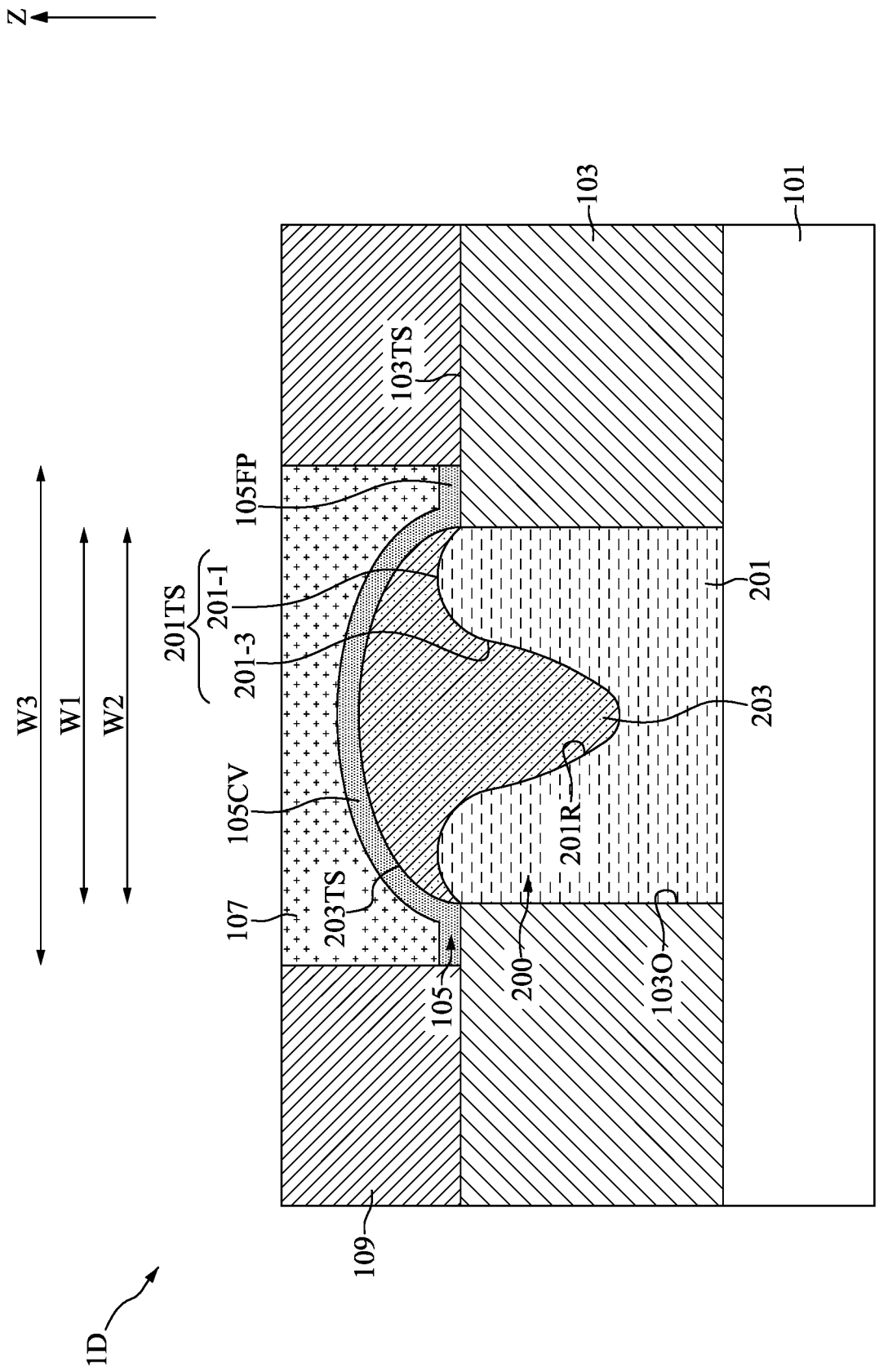

FIGS. 17 and 18 illustrate, in schematic cross-sectional view diagrams, part of a flow for fabricating a semiconductor device 1D in accordance with another embodiment of the present disclosure.

With reference to FIG. 17, an intermediate semiconductor device may be fabricated with a procedure similar to that illustrated in FIGS. 13 and 14, and descriptions thereof are not repeated herein. It should be noted that the no planarization process is performed to the conductive filling layer 203. As a result, the top surface 203TS of the conductive filling layer 203 is convex with respect to the top surface 103TS of the first dielectric layer 103 or the substrate 101. The layer of barrier material 403 may be directly formed on the conductive filling layer 203 and the first dielectric layer 103 with a procedure similar to that illustrated in FIG. 8, and descriptions thereof are not repeated herein. Due to no planarization process is performed to the conductive filling layer 203, the portion of the layer of barrier material 403 formed on the conductive filling layer 203 may be also convex with respect to the top surface 103TS of the first dielectric layer 103 of the substrate 101.

With reference to FIG. 17, the layer of second conductive material 405 may be formed on the layer of barrier material 403 with a procedure similar to that illustrated in FIG. 8, and descriptions thereof are not repeated herein. A planarization process, such as chemical mechanical polishing, may be performed to remove excess material and provide a substantially flat surface for subsequent processing steps. The second mask layer 503 may be formed on the layer of second conductive material 405 with a procedure similar to that illustrated in FIG. 8, and descriptions thereof are not repeated herein.

With reference to FIG. 18, the barrier layer 105 and the top conductive layer 107 may be formed with a procedure similar to that illustrated in FIG. 9, and descriptions thereof are not repeated herein. The second dielectric layer 109 may be formed with a procedure similar to that illustrated in FIG. 10, and descriptions thereof are not repeated herein.

With reference to FIG. 18, the barrier layer 105 may include a convex portion 105CV and two flat portions 105FP. The convex portion 105CV may be conformally formed on the top surface 203TS of the conductive filling layer 203. The conductive filling layer 203 may be convex with respect to the top surface 103TS of the first dielectric layer 103 or the substrate 101. The two flat portions 105FP may extend from two ends of the convex portion 105CV and conformally formed on the top surface 103TS of the first dielectric layer 103. In some embodiments, the width W3 of the barrier layer 105 or the top conductive layer 107 may be greater than the width W1 of the conductive concave layer 201 or greater than the width W2 of the conductive filling layer 203. In some embodiments, the width W1 of the conductive concave layer 201 and the width W2 of the conductive filling layer 203 may be substantially the same.

FIGS. 19 to 23 illustrate, in schematic cross-sectional view diagrams, semiconductor devices 1E, 1F, 1G, 1H, and 1I in accordance with some embodiments of the present disclosure.

Figure 19:
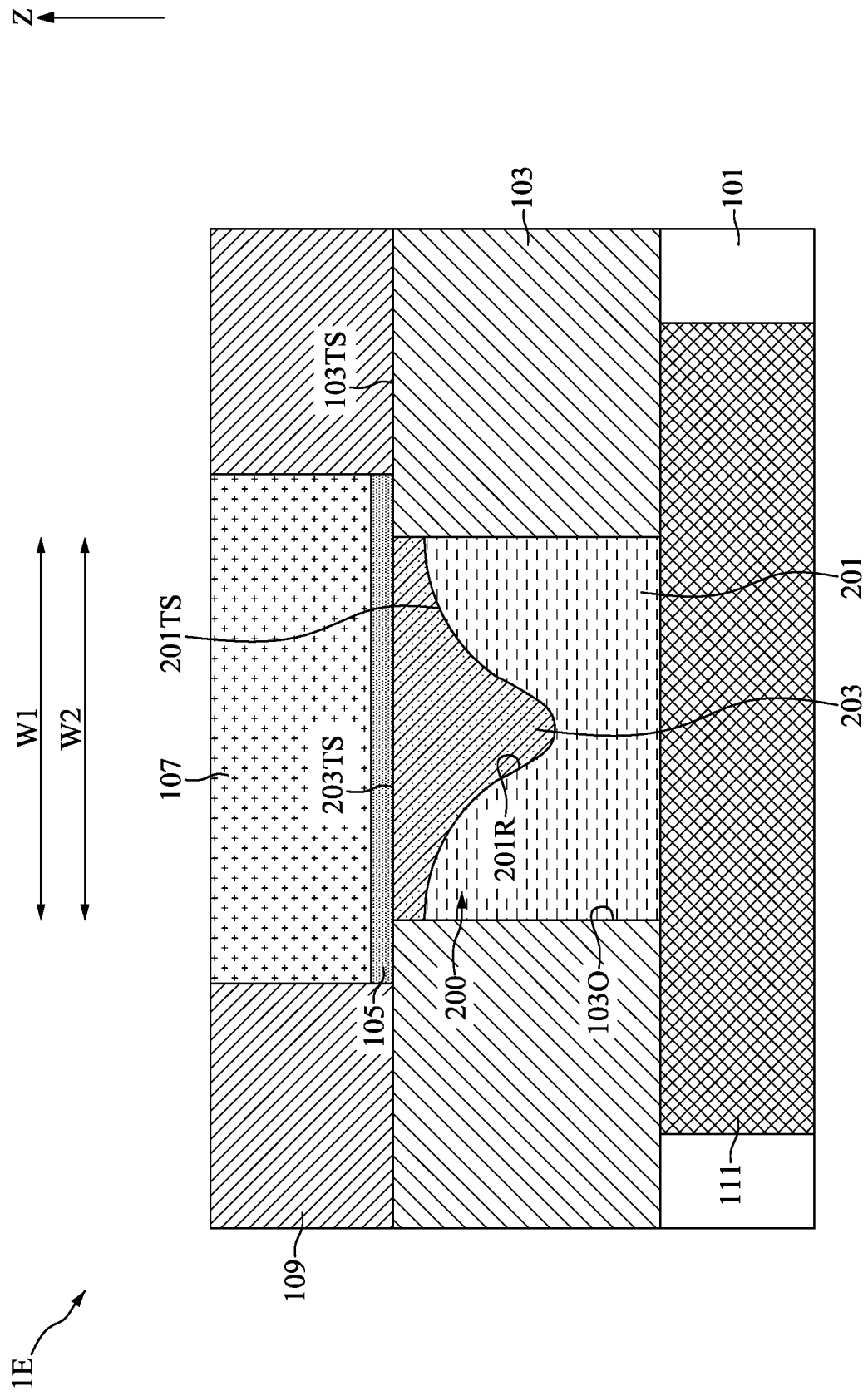
FIGS. 19 to 23 illustrate, in schematic cross-sectional view diagrams, semiconductor devices in accordance with some embodiments of the present disclosure.

With reference to FIG. 19, the semiconductor device 1E may have a structure similar to that illustrated in FIG. 10. The same or similar elements in FIG. 19 as in FIG. 10 have been marked with similar reference numbers and duplicative descriptions have been omitted.

With reference to FIG. 19, the semiconductor device 1E may include a bottom conductive layer 111. The bottom conductive layer 111 may be disposed in the substrate 101. In some embodiments, the bottom conductive layer 111 may be an impurity region configured as a source/drain. In some embodiments, the bottom conductive layer 111 may be a metal line, a conductive via, a conductive plug, or a conductive pad. The conductive structure 200 is disposed on the bottom conductive layer 111. In some embodiments, the bottom conductive layer 111 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 20:
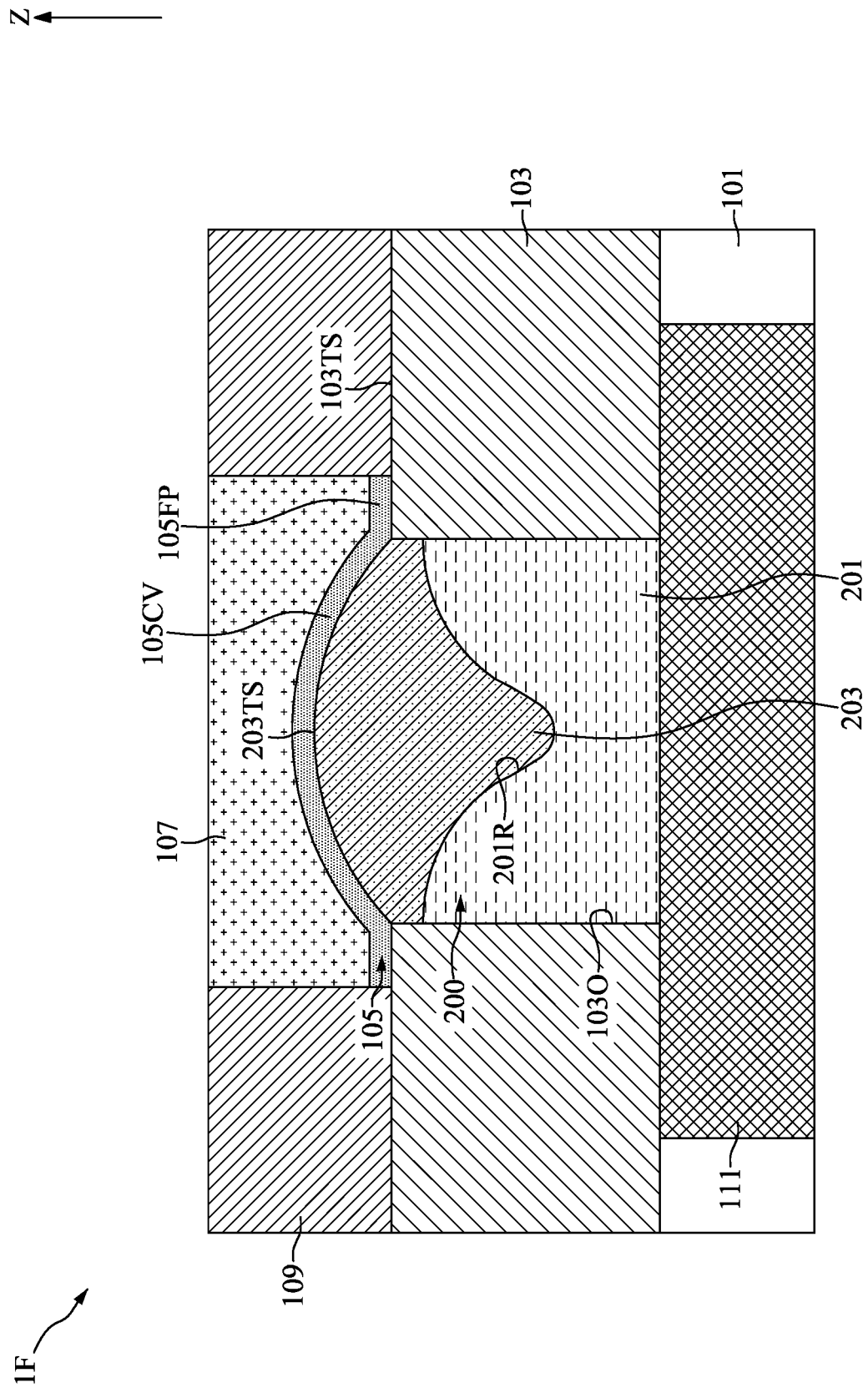

With reference to FIG. 20, the semiconductor device 1F may have a structure similar to that illustrated in FIG. 12. The same or similar elements in FIG. 20 as in FIG. 12 have been marked with similar reference numbers and duplicative descriptions have been omitted.

With reference to FIG. 20, the semiconductor device 1F may include a bottom conductive layer 111. The bottom conductive layer 111 may be disposed in the substrate 101. In some embodiments, the bottom conductive layer 111 may be an impurity region configured as a source/drain. In some embodiments, the bottom conductive layer 111 may be a metal line, a conductive via, a conductive plug, or a conductive pad. The conductive structure 200 is disposed on the bottom conductive layer 111. In some embodiments, the bottom conductive layer 111 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 21:
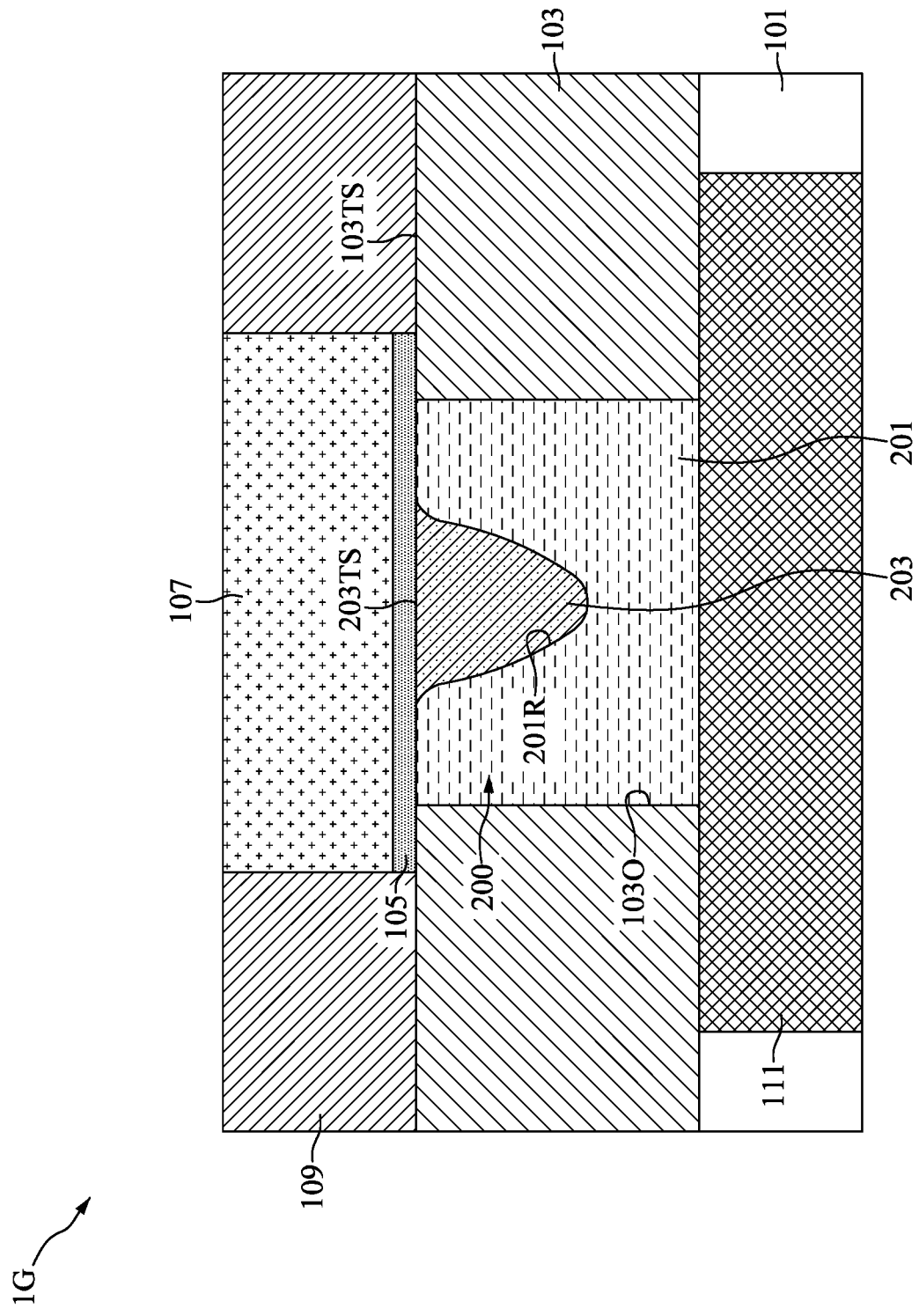

With reference to FIG. 21, the semiconductor device 1G may have a structure similar to that illustrated in FIG. 16. The same or similar elements in FIG. 21 as in FIG. 16 have been marked with similar reference numbers and duplicative descriptions have been omitted.

With reference to FIG. 21, the semiconductor device 1G may include a bottom conductive layer 111. The bottom conductive layer 111 may be disposed in the substrate 101. In some embodiments, the bottom conductive layer 111 may be an impurity region configured as a source/drain. In some embodiments, the bottom conductive layer 111 may be a metal line, a conductive via, a conductive plug, or a conductive pad. The conductive structure 200 is disposed on the bottom conductive layer 111. In some embodiments, the bottom conductive layer 111 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 22:
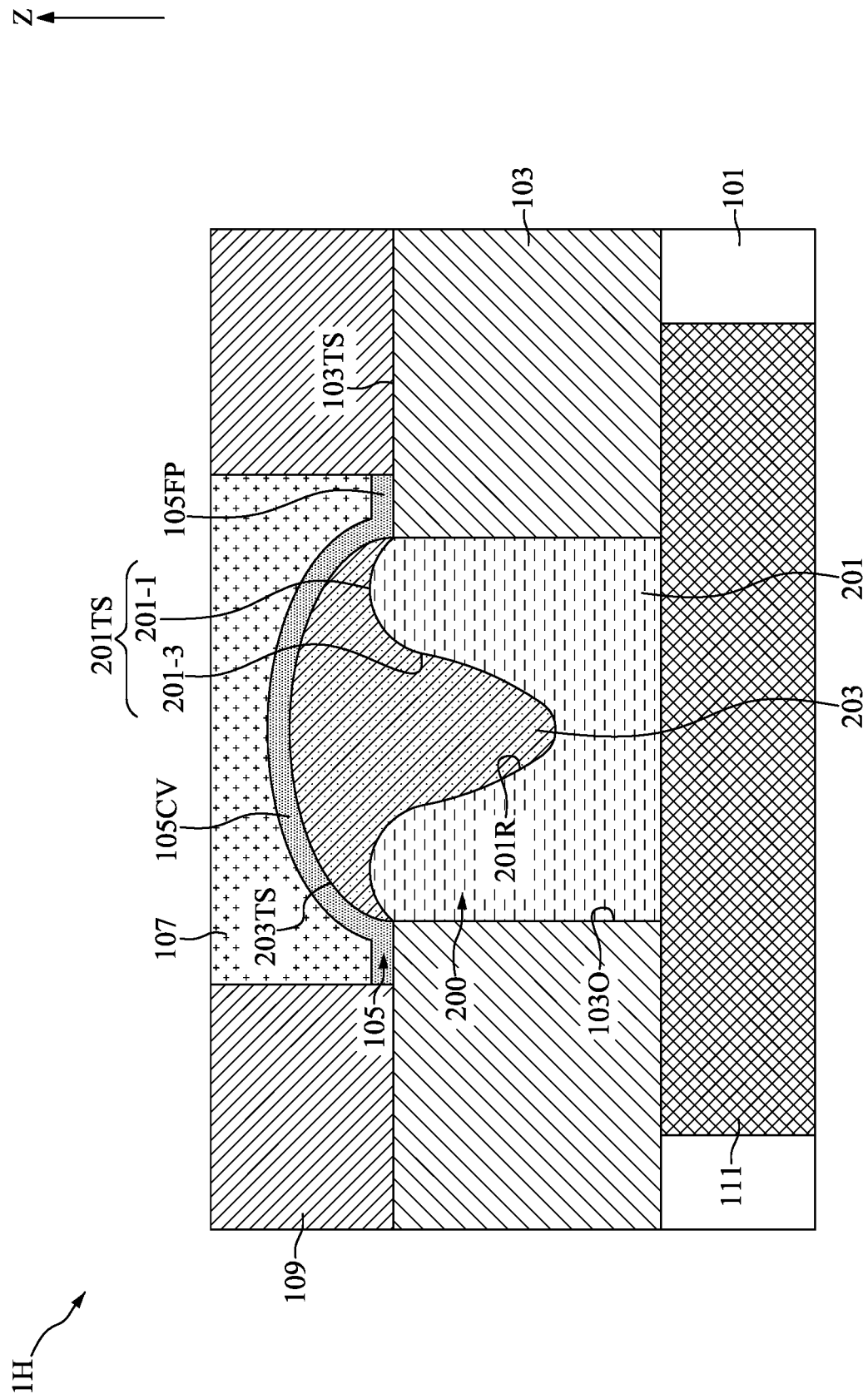

With reference to FIG. 22, the semiconductor device 1H may have a structure similar to that illustrated in FIG. 18. The same or similar elements in FIG. 22 as in FIG. 18 have been marked with similar reference numbers and duplicative descriptions have been omitted.

With reference to FIG. 22, the semiconductor device 1H may include a bottom conductive layer 111. The bottom conductive layer 111 may be disposed in the substrate 101. In some embodiments, the bottom conductive layer 111 may be an impurity region configured as a source/drain. In some embodiments, the bottom conductive layer 111 may be a metal line, a conductive via, a conductive plug, or a conductive pad. The conductive structure 200 is disposed on the bottom conductive layer 111. In some embodiments, the bottom conductive layer 111 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 23:
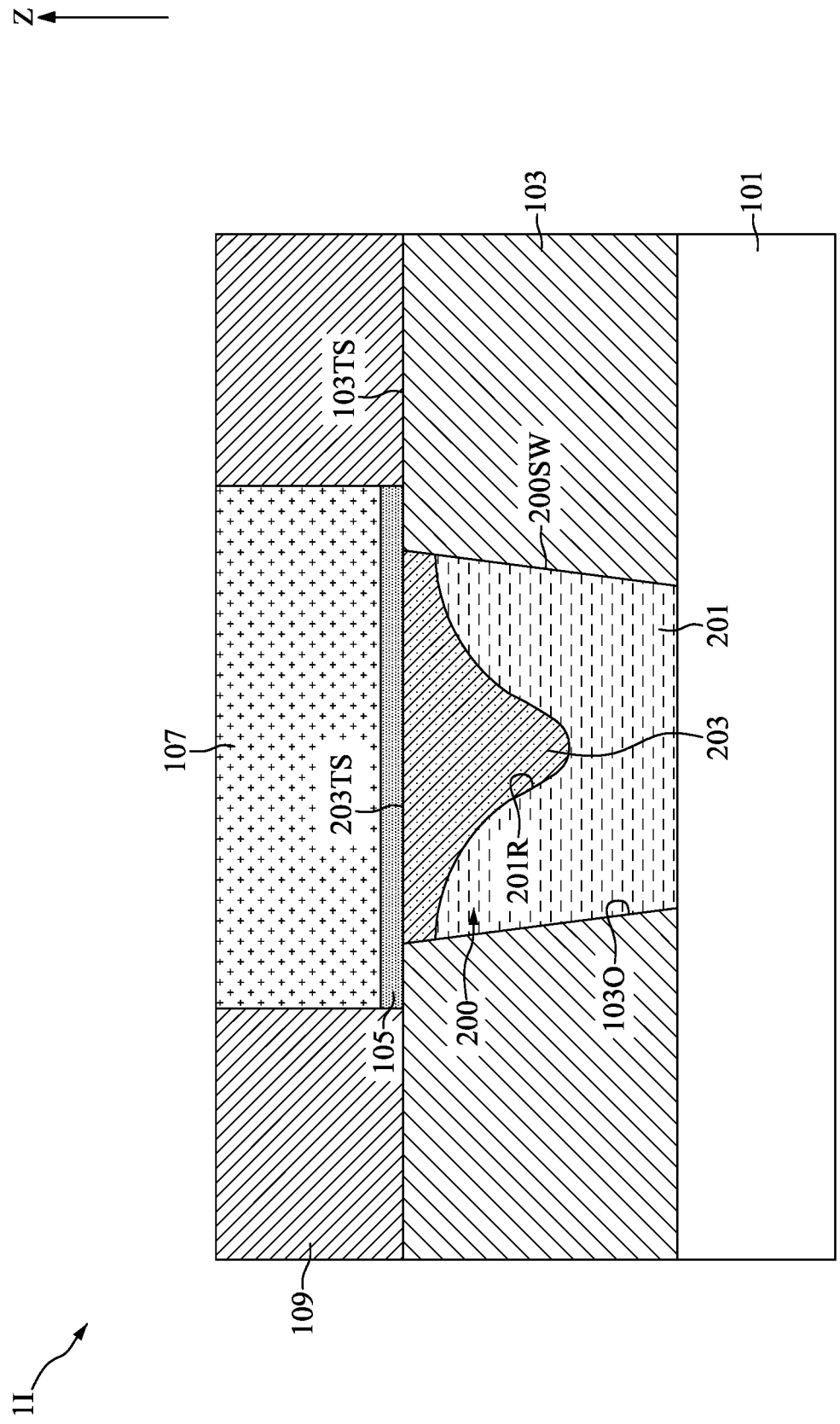

With reference to FIG. 23, the semiconductor device 1I may have a structure similar to that illustrated in FIG. 10. The same or similar elements in FIG. 23 as in FIG. 10 have been marked with similar reference numbers and duplicative descriptions have been omitted. In the semiconductor device 1I, the sidewall 200SW of the conductive structure 200 may be tapered.

One aspect of the present disclosure provides a semiconductor device including a substrate; a conductive structure including a conductive concave layer positioned on the substrate and including a top surface having a V-shaped cross-sectional profile; and a conductive filling layer positioned on the conductive concave layer; and a top conductive layer positioned on the conductive structure. The conductive filling layer includes germanium or silicon germanium.

Another aspect of the present disclosure provides a semiconductor device including a bottom conductive layer; a conductive structure including a conductive concave layer positioned on the bottom conductive layer and including a top surface having a V-shaped cross-sectional profile; and a conductive filling layer positioned on the conductive concave layer; and a top conductive layer positioned on the conductive structure. The conductive filling layer includes germanium or silicon germanium.

Another aspect of the present disclosure provides a method for fabricating a semiconductor device including providing a substrate; forming a first dielectric layer on the substrate; forming a first opening along the first dielectric layer; forming a conductive concave layer in the first opening; forming a conductive filling layer on the conductive concave layer; and forming a top conductive layer on the conductive filling layer. A top surface of the conductive concave layer has a V-shaped cross-sectional profile. The conductive concave layer and the conductive filling layer together configure a conductive structure. The conductive filling layer includes germanium or silicon germanium.

Due to the design of the semiconductor device of the present disclosure, the resistance of the conductive structure 200 may be reduced by employing the conductive filling layer 203 including germanium. As a result, performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a substrate;
    a conductive structure comprising:
        a conductive concave layer positioned on the substrate and comprising a top surface having a V-shaped cross-sectional profile; and
        a conductive filling layer positioned on the conductive concave layer; and
    a top conductive layer positioned on the conductive structure;
    wherein the conductive filling layer comprises germanium or silicon germanium;
    wherein the conductive concave layer comprises silicon and/or germanium with substantially no oxygen and nitrogen.

2. The semiconductor device of claim 1, further comprising a first dielectric layer positioned on the substrate, wherein the conductive structure is positioned in the first dielectric layer.

3. The semiconductor device of claim 2, further comprising a barrier layer positioned between the conductive structure and the top conductive layer.

4. The semiconductor device of claim 3, wherein the first dielectric layer comprises a dielectric material comprising oxygen atoms and/or nitrogen atoms.

5. The semiconductor device of claim 4, wherein the barrier layer comprises titanium, titanium nitride, tantalum, tantalum nitride, or a combination thereof.

6. The semiconductor device of claim 5, wherein the top conductive layer comprises aluminum, tungsten, copper, or a combination thereof.

7. The semiconductor device of claim 6, wherein a width of the conductive concave layer is greater than a width of the conductive filling layer.

8. The semiconductor device of claim 7, wherein a top surface of the conductive filling layer is substantially coplanar with a top surface of the first dielectric layer are substantially coplanar.

9. The semiconductor device of claim 6, wherein a width of the conductive concave layer and a width of the conductive filling layer are substantially the same.

10. The semiconductor device of claim 9, wherein a top surface of the conductive filling layer and a top surface of the first dielectric layer are substantially coplanar.

11. The semiconductor device of claim 10, wherein a sidewall of the conductive structure is tapered.

12. The semiconductor device of claim 9, wherein a top surface of the conductive filling layer is convex with respect to a top surface of the first dielectric layer.

13. The semiconductor device of claim 9, wherein the top surface of the conductive concave layer comprises a first portion and a second portion, the first portion is convex with respect to the substrate and positioned adjacent to the first dielectric layer, and the second portion extends from the first portion and is concave with respect to the substrate.

14. The semiconductor device of claim 13, wherein a top surface of the conductive filling layer is convex with respect to the substrate.

15. The semiconductor device of claim 14, wherein the barrier layer comprises a convex portion and two flat portions, the convex portion is conformally positioned on the top surface of the conductive filling layer and is convex with respect to the substrate, and the two flat portions extend from two ends of the convex portion and is conformally positioned on a top surface of the first dielectric layer.

* * * * *